(12) United States Patent
Gupta et al.

(10) Patent No.: US 10,886,273 B2
(45) Date of Patent: Jan. 5, 2021

(54) GATED BIPOLAR JUNCTION TRANSISTORS, MEMORY ARRAYS, AND METHODS OF FORMING GATED BIPOLAR JUNCTION TRANSISTORS

(71) Applicant: Micron Technology, Inc., Boise, ID (US)

(72) Inventors: Rajesh N. Gupta, Karnataka (IN); Farid Nemati, Redwood City, CA (US); Scott T. Robins, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/436,689

(22) Filed: Jun. 10, 2019

(65) Prior Publication Data
US 2019/0296016 A1 Sep. 26, 2019

Related U.S. Application Data

(62) Division of application No. 14/613,876, filed on Feb. 4, 2015, now Pat. No. 10,373,956, which is a division
(Continued)

(51) Int. Cl.
*H01L 21/8249* (2006.01)
*H01L 27/102* (2006.01)
(Continued)

(52) U.S. Cl.
CPC .... *H01L 27/1026* (2013.01); *H01L 21/02381* (2013.01); *H01L 21/02529* (2013.01);
(Continued)

(58) Field of Classification Search
CPC ............... H01L 27/108; H01L 29/7841; H01L 27/10802; H01L 27/1203; H01L 21/8249;
(Continued)

(56) References Cited

U.S. PATENT DOCUMENTS

| | | |
|---|---|---|
| 3,988,771 A | 10/1976 | Krishna |
| 4,487,639 A | 12/1984 | Lam et al. |
| | (Continued) | |

FOREIGN PATENT DOCUMENTS

| | | |
|---|---|---|
| CN | 101405849 | 8/2009 |
| CN | 101621036 | 1/2010 |
| | (Continued) | |

OTHER PUBLICATIONS

CN 201180011589.X SR Trans., dated Aug. 21, 2014, Micron Technology, Inc.
(Continued)

*Primary Examiner* — Meiya Li
(74) *Attorney, Agent, or Firm* — Wells St. John P.S.

(57) ABSTRACT

Some embodiments include gated bipolar junction transistors. The transistors may include a base region between a collector region and an emitter region; with a B-C junction being at an interface of the base region and the collector region, and with a B-E junction being at an interface of the base region and the emitter region. The transistors may include material having a bandgap of at least 1.2 eV within one or more of the base, emitter and collector regions. The gated transistors may include a gate along the base region and spaced from the base region by dielectric material, with the gate not overlapping either the B-C junction or the B-E junction. Some embodiments include memory arrays containing gated bipolar junction transistors. Some embodiments include methods of forming gated bipolar junction transistors.

8 Claims, 15 Drawing Sheets

Related U.S. Application Data of application No. 13/037,642, filed on Mar. 1, 2011, now Pat. No. 8,952,418.

(51) Int. Cl.

| | |
|---|---|
| *H01L 29/735* | (2006.01) |
| *H01L 29/73* | (2006.01) |
| *H01L 21/02* | (2006.01) |
| *H01L 21/8229* | (2006.01) |
| *H01L 29/16* | (2006.01) |
| *H01L 29/732* | (2006.01) |
| *H01L 29/739* | (2006.01) |
| H01L 27/108 | (2006.01) |
| H01L 29/78 | (2006.01) |

(52) U.S. Cl.
CPC ...... *H01L 21/8229* (2013.01); *H01L 27/1023* (2013.01); *H01L 27/1024* (2013.01); *H01L 29/1608* (2013.01); *H01L 29/73* (2013.01); *H01L 29/732* (2013.01); *H01L 29/735* (2013.01); *H01L 29/7391* (2013.01); *H01L 27/10802* (2013.01); *H01L 29/7841* (2013.01); H01L 2924/0002 (2013.01)

(58) Field of Classification Search
CPC ............... H01L 27/11; H01L 29/78687; H01L 27/0623; H01L 27/0688; H01L 27/0705; H01L 29/7317; H01L 27/0635; H01L 27/1023; H01L 27/10841; H01L 21/8222; H01L 27/0262; H01L 29/66325; H01L 29/739; H01L 45/1233; H01L 21/02381; H01L 21/02529; H01L 21/8229; H01L 27/2436; H01L 27/2454; H01L 29/1608; H01L 29/73; H01L 29/732; H01L 29/7391; H01L 45/16; G11C 2211/4016; G11C 11/404

See application file for complete search history.

(56) References Cited

U.S. PATENT DOCUMENTS

| | | | |
|---|---|---|---|
| 5,098,861 A | 3/1992 | Blackstone |
| 5,102,821 A | 4/1992 | Moslehi |
| 5,106,776 A | 4/1992 | Shen et al. |
| 5,260,233 A | 11/1993 | Buti et al. |
| 5,373,184 A | 12/1994 | Moslehi |
| 5,378,316 A | 1/1995 | Franke et al. |
| 5,412,598 A | 5/1995 | Shulman |
| 5,465,249 A | 11/1995 | Cooper, Jr. et al. |
| 5,471,039 A | 11/1995 | Irwin, Jr. et al. |
| 5,510,630 A | 4/1996 | Agarwal et al. |
| 5,563,084 A | 10/1996 | Ramm et al. |
| 5,600,160 A | 2/1997 | Hvistendahl |
| 5,874,760 A | 2/1999 | Burns, Jr. et al. |
| 5,904,507 A | 5/1999 | Thomas |
| 5,909,618 A | 6/1999 | Forbes et al. |
| 5,920,105 A | 7/1999 | Okamoto et al. |
| 5,930,640 A | 7/1999 | Kenney |
| 5,936,274 A | 8/1999 | Forbes et al. |
| 5,963,469 A | 10/1999 | Forbes |
| 6,017,778 A | 1/2000 | Pezzani |
| 6,033,957 A | 3/2000 | Burns, Jr. et al. |
| 6,137,128 A | 10/2000 | Holmes et al. |
| 6,191,476 B1 | 2/2001 | Takahashi et al. |
| 6,225,151 B1 | 5/2001 | Gardner et al. |
| 6,225,165 B1 | 5/2001 | Noble, Jr. et al. |
| 6,229,161 B1 | 5/2001 | Nemati et al. |
| 6,245,663 B1 | 6/2001 | Zhao et al. |
| 6,255,731 B1 | 7/2001 | Ohmi et al. |
| 6,274,888 B1 | 8/2001 | Suzuki et al. |
| 6,291,836 B1 | 9/2001 | Kramer et al. |
| 6,294,418 B1 | 9/2001 | Noble |
| 6,303,468 B1 | 10/2001 | Aspar et al. |
| 6,335,231 B1 | 1/2002 | Yamazaki et al. |
| 6,335,258 B1 | 1/2002 | Aspar et al. |
| 6,352,894 B1 | 3/2002 | Goebel et al. |
| 6,355,501 B1 | 3/2002 | Fung et al. |
| 6,355,520 B1 | 3/2002 | Park et al. |
| 6,365,488 B1 | 4/2002 | Liao |
| 6,391,658 B1 | 5/2002 | Gates et al. |
| 6,492,662 B2 | 12/2002 | Hsu et al. |
| 6,525,953 B1 | 2/2003 | Johnson |
| 6,559,471 B2 | 5/2003 | Finder et al. |
| 6,576,944 B2 | 6/2003 | Weis |
| 6,593,624 B2 | 7/2003 | Walker |
| 6,600,173 B2 | 7/2003 | Tiwari |
| 6,627,924 B2 | 9/2003 | Hsu et al. |
| 6,649,980 B2 | 11/2003 | Noguchi |
| 6,653,174 B1 | 11/2003 | Cho et al. |
| 6,690,038 B1 | 2/2004 | Cho et al. |
| 6,690,039 B1 | 2/2004 | Nemati et al. |
| 6,713,791 B2 | 3/2004 | Hsu et al. |
| 6,713,810 B1 | 3/2004 | Bhattacharyya |
| 6,727,529 B2 | 4/2004 | Nemati et al. |
| 6,744,094 B2 | 6/2004 | Forbes |
| 6,756,286 B1 | 6/2004 | Moriceau et al. |
| 6,764,774 B2 | 7/2004 | Grill et al. |
| 6,768,156 B1 | 7/2004 | Bhattacharyya |
| 6,777,745 B2 | 8/2004 | Hshieh et al. |
| 6,809,044 B1 | 10/2004 | Aspar et al. |
| 6,812,504 B2 | 11/2004 | Bhattacharyya |
| 6,815,781 B2 | 11/2004 | Vyvoda et al. |
| 6,841,813 B2 | 1/2005 | Walker et al. |
| 6,845,034 B2 | 1/2005 | Bhattacharyya |
| 6,870,202 B2 | 3/2005 | Oka |
| 6,881,994 B2 | 4/2005 | Lee et al. |
| 6,882,008 B1 | 4/2005 | Ohsawa |
| 6,888,199 B2 | 5/2005 | Nowak et al. |
| 6,891,205 B1 | 5/2005 | Cho et al. |
| 6,906,354 B2 | 6/2005 | Hsu et al. |
| 6,914,286 B2 | 7/2005 | Park |
| 6,934,209 B2 | 8/2005 | Marr |
| 6,940,748 B2 | 9/2005 | Nejad et al. |
| 6,940,761 B2 | 9/2005 | Forbes |
| 6,946,365 B2 | 9/2005 | Aspar et al. |
| 6,953,953 B1 | 10/2005 | Horch |
| 6,958,263 B2 | 10/2005 | Bhattacharyya |
| 6,958,513 B2 | 10/2005 | Wang |
| 6,965,129 B1 | 11/2005 | Horch et al. |
| 6,992,349 B2 | 1/2006 | Lee et al. |
| 6,995,456 B2 | 2/2006 | Nowak |
| 7,015,092 B2 | 3/2006 | Jaiprakash et al. |
| 7,029,956 B2 | 4/2006 | Hsu et al. |
| 7,052,941 B2 | 5/2006 | Lee |
| 7,075,146 B2 | 7/2006 | Forbes |
| 7,081,663 B2 | 7/2006 | Bulucea |
| 7,115,939 B2 | 10/2006 | Forbes |
| 7,120,046 B1 | 10/2006 | Forbes |
| 7,129,538 B2 | 10/2006 | Lee |
| 7,151,024 B1 | 12/2006 | Forbes |
| 7,157,771 B2 | 1/2007 | Forbes |
| 7,158,401 B2 | 1/2007 | Bhattacharyya |
| RE39,484 E | 2/2007 | Bruel |
| 7,180,135 B1 | 2/2007 | Ioannou |
| 7,195,959 B1 | 3/2007 | Plummer et al. |
| 7,205,185 B2 | 4/2007 | Dokumaci et al. |
| 7,250,628 B2 | 7/2007 | Bhattacharyya |
| 7,250,646 B2 | 7/2007 | Walker et al. |
| 7,259,415 B1 | 8/2007 | Forbes |
| 7,268,373 B1 | 9/2007 | Gupta et al. |
| 7,271,052 B1 | 9/2007 | Forbes |
| 7,279,740 B2 | 10/2007 | Bhattacharyya et al. |
| 7,304,327 B1 | 12/2007 | Hsu et al. |
| 7,323,380 B2 | 1/2008 | Forbes |
| 7,326,969 B1 | 2/2008 | Horch |
| 7,338,862 B2 | 3/2008 | Huo et al. |
| 7,358,120 B2 | 4/2008 | Furukawa et al. |
| 7,359,229 B2 | 4/2008 | Ferrant et al. |
| 7,362,609 B2 | 4/2008 | Harrison et al. |
| 7,368,352 B2 | 5/2008 | Kim et al. |
| 7,378,325 B2 | 5/2008 | Kaneko et al. |

(56) References Cited

U.S. PATENT DOCUMENTS

| | | |
|---|---|---|
| 7,410,867 B2 | 8/2008 | Forbes |
| 7,415,690 B2 | 8/2008 | Liang et al. |
| 7,440,310 B2 | 10/2008 | Bhattacharyya |
| 7,456,439 B1 | 11/2008 | Horch |
| 7,476,939 B2 | 1/2009 | Okhonin et al. |
| 7,488,627 B1 | 2/2009 | Nemati et al. |
| 7,491,608 B2 | 2/2009 | Forbes |
| 7,518,182 B2 | 4/2009 | Abbott et al. |
| 7,525,137 B2 | 4/2009 | Walker et al. |
| 7,538,000 B2 | 5/2009 | Dao |
| 7,560,336 B2 | 7/2009 | Abbott |
| 7,579,240 B2 | 8/2009 | Forbes |
| 7,589,995 B2 | 9/2009 | Tang et al. |
| 7,592,209 B2 | 9/2009 | Chang |
| 7,615,436 B2 | 11/2009 | Kouznetsov et al. |
| 7,619,917 B2 | 11/2009 | Nirschl et al. |
| 7,629,651 B2 | 12/2009 | Nakajima |
| 7,663,188 B2 | 2/2010 | Chung |
| 7,736,969 B2 | 6/2010 | Abbott et al. |
| 7,786,505 B1 | 8/2010 | Yang et al. |
| 7,816,728 B2 | 10/2010 | Ho et al. |
| 7,825,455 B2 | 11/2010 | Lee et al. |
| 7,838,360 B2 | 11/2010 | Forbes |
| 7,851,859 B2 | 12/2010 | Kyun et al. |
| 7,883,962 B2 | 2/2011 | Noble |
| 7,897,440 B1 | 3/2011 | Horch |
| 7,929,343 B2 | 4/2011 | Tang et al. |
| 8,018,058 B2 | 9/2011 | Lee |
| 8,084,316 B2 | 12/2011 | Huo et al. |
| 8,102,025 B2 | 1/2012 | Ozeki et al. |
| 8,148,780 B2 | 4/2012 | Tang et al. |
| 8,476,145 B2 | 7/2013 | Or-Bach et al. |
| 8,501,559 B2 | 8/2013 | Tang et al. |
| 8,501,581 B2 | 8/2013 | Tang et al. |
| 8,507,866 B2 | 8/2013 | Tang et al. |
| 8,518,812 B2 | 8/2013 | Mariani et al. |
| 8,519,431 B2 | 8/2013 | Nemati et al. |
| 8,524,543 B2 | 9/2013 | Tang |
| 8,558,220 B2 | 10/2013 | Schricker et al. |
| 8,598,621 B2 | 12/2013 | Tang |
| 8,772,848 B2 | 7/2014 | Zahurak |
| 9,209,187 B1 | 12/2015 | Mariani et al. |
| 9,214,389 B2 | 12/2015 | Righetti et al. |
| 9,224,738 B1 | 12/2015 | Zanderigo et al. |
| 2001/0002062 A1 | 5/2001 | Noble, Jr. et al. |
| 2001/0024841 A1 | 9/2001 | Noble, Jr. et al. |
| 2001/0026477 A1 | 10/2001 | Manning |
| 2001/0048119 A1 | 12/2001 | Mizuno et al. |
| 2002/0024152 A1 | 2/2002 | Momoi et al. |
| 2002/0028541 A1 | 3/2002 | Lee et al. |
| 2002/0070454 A1 | 6/2002 | Yasukawa |
| 2002/0079537 A1 | 6/2002 | Houston |
| 2002/0081753 A1 | 6/2002 | Gates et al. |
| 2002/0094619 A1 | 7/2002 | Mandelman et al. |
| 2002/0142562 A1 | 10/2002 | Chan et al. |
| 2002/0158254 A1 | 10/2002 | Hsu et al. |
| 2002/0163019 A1 | 11/2002 | Mohsen |
| 2002/0185684 A1 | 12/2002 | Campbell et al. |
| 2002/0190265 A1 | 12/2002 | Hsu et al. |
| 2002/0190298 A1 | 12/2002 | Alsmeier et al. |
| 2002/0195655 A1 | 12/2002 | Hshieh et al. |
| 2003/0006461 A1 | 1/2003 | Tezuka et al. |
| 2003/0102469 A1 | 6/2003 | Jones et al. |
| 2003/0164501 A1 | 9/2003 | Suzuki et al. |
| 2003/0186521 A1 | 10/2003 | Kub et al. |
| 2003/0211705 A1 | 11/2003 | Tong et al. |
| 2003/0223292 A1 | 12/2003 | Nejad et al. |
| 2003/0235710 A1 | 12/2003 | Grill et al. |
| 2004/0007717 A1 | 1/2004 | Yoo |
| 2004/0022105 A1 | 2/2004 | Ohsawa |
| 2004/0094758 A1 | 5/2004 | Usuda et al. |
| 2004/0097022 A1 | 5/2004 | Werkhoven |
| 2004/0130015 A1 | 7/2004 | Ogihara et al. |
| 2004/0159853 A1 | 8/2004 | Nemati et al. |
| 2004/0174734 A1 | 9/2004 | Forbes |
| 2004/0214379 A1 | 10/2004 | Lee et al. |
| 2004/0233761 A1 | 11/2004 | Schwabe et al. |
| 2004/0256639 A1* | 12/2004 | Ouyang .......... H01L 21/823807 257/202 |
| 2004/0262635 A1 | 12/2004 | Lee |
| 2004/0262679 A1 | 12/2004 | Ohsawa |
| 2005/0001232 A1 | 1/2005 | Bhattacharyya |
| 2005/0023656 A1 | 2/2005 | Leedy |
| 2005/0037582 A1 | 2/2005 | Dennard et al. |
| 2005/0059252 A1 | 3/2005 | Dokumaci et al. |
| 2005/0062079 A1 | 3/2005 | Wu et al. |
| 2005/0146955 A1 | 7/2005 | Kajiyama |
| 2005/0230356 A1 | 10/2005 | Empedocles et al. |
| 2005/0282318 A1 | 12/2005 | Dao |
| 2005/0282356 A1 | 12/2005 | Lee |
| 2006/0010056 A1 | 1/2006 | De La Motte |
| 2006/0034116 A1 | 2/2006 | Lam et al. |
| 2006/0071074 A1 | 4/2006 | Konevecki et al. |
| 2006/0082004 A1 | 4/2006 | Parekh et al. |
| 2006/0083058 A1 | 4/2006 | Ohsawa |
| 2006/0099776 A1 | 5/2006 | Dupont |
| 2006/0124974 A1 | 6/2006 | Cabral, Jr. et al. |
| 2006/0125011 A1 | 6/2006 | Chang |
| 2006/0197115 A1 | 9/2006 | Toda |
| 2006/0227601 A1 | 10/2006 | Bhattacharyya |
| 2006/0249770 A1 | 11/2006 | Huo et al. |
| 2007/0012945 A1 | 1/2007 | Sugizaki |
| 2007/0018166 A1 | 1/2007 | Atanackovic et al. |
| 2007/0018223 A1 | 1/2007 | Abbott |
| 2007/0023805 A1 | 2/2007 | Wells et al. |
| 2007/0023817 A1 | 2/2007 | Dao |
| 2007/0029607 A1 | 2/2007 | Kouznetzov |
| 2007/0045709 A1 | 3/2007 | Yang |
| 2007/0047364 A1 | 3/2007 | Chuang et al. |
| 2007/0051994 A1 | 3/2007 | Song et al. |
| 2007/0057328 A1 | 3/2007 | Taniguchi et al. |
| 2007/0064342 A1 | 3/2007 | Nakamura |
| 2007/0077694 A1 | 4/2007 | Lee |
| 2007/0080385 A1 | 4/2007 | Kim et al. |
| 2007/0121696 A1 | 5/2007 | Ishii |
| 2007/0127289 A1 | 6/2007 | Lee |
| 2007/0178649 A1 | 8/2007 | Swift et al. |
| 2007/0215954 A1 | 9/2007 | Mouli |
| 2007/0252175 A1 | 11/2007 | Tang et al. |
| 2007/0264771 A1 | 11/2007 | Ananthan et al. |
| 2008/0003774 A1 | 1/2008 | Baek |
| 2008/0003778 A1 | 1/2008 | Eyck |
| 2008/0041517 A1 | 2/2008 | Moriceau et al. |
| 2008/0124867 A1 | 5/2008 | Brown |
| 2008/0128802 A1 | 6/2008 | Huo et al. |
| 2008/0149984 A1 | 6/2008 | Chang et al. |
| 2008/0164528 A1 | 7/2008 | Cohen et al. |
| 2008/0200014 A1 | 8/2008 | Park et al. |
| 2008/0211023 A1 | 9/2008 | Shino |
| 2008/0211061 A1 | 9/2008 | Atwater, Jr. et al. |
| 2008/0233694 A1 | 9/2008 | Li |
| 2008/0237776 A1 | 10/2008 | Abbott |
| 2008/0246023 A1 | 10/2008 | Zeng et al. |
| 2008/0296712 A1 | 12/2008 | Feuillet |
| 2008/0299753 A1 | 12/2008 | Figura et al. |
| 2009/0003025 A1 | 1/2009 | Mokhlesi et al. |
| 2009/0010056 A1 | 1/2009 | Kuo et al. |
| 2009/0014813 A1 | 1/2009 | Chao et al. |
| 2009/0022003 A1 | 1/2009 | Song et al. |
| 2009/0026522 A1 | 1/2009 | Ananthan |
| 2009/0050948 A1 | 2/2009 | Ishikawa |
| 2009/0072341 A1 | 3/2009 | Liu et al. |
| 2009/0079030 A1 | 3/2009 | Cheng et al. |
| 2009/0108351 A1 | 4/2009 | Yang et al. |
| 2009/0129145 A1 | 5/2009 | Slesazeck |
| 2009/0140290 A1 | 6/2009 | Schulze et al. |
| 2009/0170261 A1 | 7/2009 | Lee |
| 2009/0173984 A1 | 7/2009 | Wang |
| 2009/0179262 A1 | 7/2009 | Holz |
| 2009/0189228 A1 | 7/2009 | Zhang et al. |
| 2009/0200536 A1 | 8/2009 | Van Schaijk et al. |
| 2009/0201723 A1 | 8/2009 | Okhonin et al. |
| 2009/0207681 A1 | 8/2009 | Juengling |
| 2009/0213648 A1 | 8/2009 | Slesazeck |

(56) References Cited

U.S. PATENT DOCUMENTS

| | | |
|---|---|---|
| 2009/0218656 A1 | 9/2009 | Gonzalez et al. |
| 2009/0242865 A1 | 10/2009 | Lung et al. |
| 2009/0246952 A1 | 10/2009 | Ishizaka et al. |
| 2009/0250738 A1 | 10/2009 | Dyer |
| 2009/0315084 A1 | 12/2009 | Cha et al. |
| 2010/0001271 A1 | 1/2010 | Fumitake |
| 2010/0006938 A1 | 1/2010 | Jang |
| 2010/0008139 A1 | 1/2010 | Bae |
| 2010/0044670 A1 | 2/2010 | Ling |
| 2010/0061145 A1 | 3/2010 | Weis |
| 2010/0197141 A1 | 8/2010 | Tu et al. |
| 2010/0200916 A1 | 8/2010 | Gossner et al. |
| 2010/0203695 A1 | 8/2010 | Oh et al. |
| 2010/0207180 A1 | 8/2010 | Lee |
| 2010/0248153 A1 | 9/2010 | Lee et al. |
| 2010/0277982 A1 | 11/2010 | Okhonin |
| 2011/0006377 A1 | 1/2011 | Lee et al. |
| 2011/0024791 A1 | 2/2011 | Schulze et al. |
| 2011/0121366 A1 | 5/2011 | Or-Bach et al. |
| 2011/0156044 A1 | 6/2011 | Lee et al. |
| 2011/0163357 A1 | 7/2011 | Tan et al. |
| 2011/0215371 A1 | 9/2011 | Tang et al. |
| 2011/0215396 A1 | 9/2011 | Tang et al. |
| 2011/0215407 A1 | 9/2011 | Tang et al. |
| 2011/0215408 A1 | 9/2011 | Tang et al. |
| 2011/0215436 A1 | 9/2011 | Tang et al. |
| 2011/0223725 A1 | 9/2011 | Kang et al. |
| 2011/0223731 A1 | 9/2011 | Chung et al. |
| 2011/0309434 A1 | 12/2011 | Huang et al. |
| 2012/0056194 A1* | 3/2012 | Dimitrijev ........ H01L 21/02381 257/77 |
| 2012/0205736 A1 | 8/2012 | Housley et al. |
| 2012/0223369 A1 | 9/2012 | Gupta et al. |
| 2012/0223380 A1 | 9/2012 | Lee et al. |
| 2014/0008721 A1 | 1/2014 | Filippini et al. |
| 2014/0106554 A1 | 4/2014 | Pozzi et al. |
| 2016/0049404 A1 | 2/2016 | Mariani et al. |

FOREIGN PATENT DOCUMENTS

| | | |
|---|---|---|
| EP | 1494288 | 1/2005 |
| EP | 1918998 | 5/2008 |
| JP | H02-275663 | 11/1990 |
| JP | H04-064249 | 2/1992 |
| JP | H04-186815 | 7/1992 |
| JP | H04-283914 | 10/1992 |
| JP | 06-104446 | 4/1994 |
| JP | H08-088153 | 4/1996 |
| JP | H10-150176 | 6/1998 |
| JP | H11-103035 | 4/1999 |
| JP | 2000-150905 | 5/2000 |
| JP | 2003-030980 | 1/2003 |
| JP | 2004-303398 | 10/2004 |
| JP | 2005-136191 | 5/2005 |
| JP | 2005-327766 | 11/2005 |
| JP | 2007-511895 | 5/2007 |
| JP | 2008-010503 | 1/2008 |
| JP | 2009-531860 | 9/2009 |
| JP | 2011-508979 | 3/2011 |
| KR | 10-0663359 | 10/2006 |
| KR | 10-0702014 | 11/2006 |
| KR | 10-0821456 | 4/2008 |
| KR | 2009-0040460 | 4/2009 |
| KR | 2009-0054245 | 5/2009 |
| KR | 10-2010-0070835 | 6/2010 |
| TW | 200802866 | 1/2008 |
| WO | WO 2007/123609 | 11/2007 |
| WO | WO 2009/088889 | 7/2009 |

OTHER PUBLICATIONS

CN 201180011589.X SR Trans., dated Apr. 10, 2015, Micron Technology, Inc.
CN 201180011628.6 SR Trans., dated Jun. 25, 2014, Micron Technology, Inc.
CN 201180011628.6 SR Trans., dated Feb. 27, 2015, Micron Technology, Inc.
CN 201180011630.3 SR Trans., Jul. 7, 2014, Micron Technology, Inc.
EP 11751050 Supp Search Report, dated Nov. 14, 2014, Micron Technology, Inc.
EP 11751053 Supp Search Report, dated Jun. 4, 2014, Micron Technology, Inc.
WO PCT/US2011/024354 IPRP, dated Sep. 4, 2012, Micron Technology, Inc.
WO PCT/US2011/024354 Search Report, dated Sep. 29, 2011, Micron Technology, Inc.
WO PCT/US2011/024354 Written Opinion, dated Sep. 29, 2011, Micron Technology, Inc.
WO PCT/US2011/024376 IPRP, dated Sep. 4, 2011, Micron Technology, Inc.
WO PCT/US2011/024376 Search Report, dated Sep. 28, 2011, Micron Technology, Inc.
WO PCT/US2011/204376 Written Opinion, dated Sep. 28, 2011, Micron Technology, Inc.
WO PCT/US2011/024387 IPRP, dated Sep. 4, 2012, Micron Technology, Inc.
WO PCT/US2011/024387 Search Report, Sep. 21, 2011, Micron Technology, Inc.
WO PCT/US2011/024387 Written Opinion, dated Sep. 21, 2011, Micron Technology, Inc.
WO PCT/US2012/021438 IPRP, dated Aug. 13, 2013, Micron Technology, Inc.
WO PCT/US2012/021438 Search Report, dated Aug. 28, 2012, Micron Technology, Inc.
WO PCT/US2012/021438 Written Opinion, dated Aug. 28, 2012, Micron Technology, Inc.
WO PCT/US2012/025109 IPRP, dated Sep. 10, 2013, Micron Technology, Inc.
WO PCT/US2012/025109 Search Report, dated Sep. 20, 2012, Micron Technology, Inc.
WO PCT/US2012/025109 Written Opinion, dated Sep. 20, 2012, Micron Technology, Inc.
WO PCT/US2012/025115 IPRP, dated Sep. 3, 2013, Micron Technology, Inc.
WO PCT/US2012/025115 Search Report, dated Sep. 24, 2012, Micron Technology, Inc.
WO PCT/US2012/025115 Written Opinion, Sep. 24, 2012, Micron Technology, Inc.
TW 100106775 Search Report Translation, dated Jun, 19, 2014, Micron Technology, Inc.
TW 100106776 Search Report Translation, dated Nov. 25, 2014, Micron Technology, Inc.
TW 100108777 SR Translation, Feb. 13, 2014, Micron Technology, Inc.
TW 101104088 SR Translation, dated Dec. 17, 2013, Micron Technology, Inc.
TW 101106601 SR Translation, dated Apr. 3, 2014, Micron Technology, Inc.
TW 101107759 SR Translation, dated Jun. 10, 2014, Micron Technology, Inc.
"IBM Builds World's Fastest Communications Microchip", Reuters U.S. Company News, Feb. 25, 2002, online at http://activequote300.fidelity.com/rtrnews/individua_n.../COMP&provider=CBSMW%26toc_select%3Dmarket_breaking_news, 1 page.
Bae et al., "A Novel SiGe-Inserted SOI Structure for High Performance PDSOI CMOSFET", IEEE Electron Devices Meeting, 2000, United States, pp. 667-670.
Belford et al., Performance-Augmented CMOS Using Back-End Uniaxial Strain, Device Research Conference Digest, 2002, United States, pp. 41-42.
Bhattacharyya, "The Role of Microelectronic Integration in Environmental Control: A Perspective", Materials Research Society Symposium Proceedings vol. 344, 1994, United States, pp. 281-293.

(56) References Cited

OTHER PUBLICATIONS

Burke et al., "Silicon Carbide Thyristors for Power Applications", 10th IEEE International Pulsed Power Conference Digest of Technical Papers vol. 1, 1995, United States, pp. 327-335.
Cheng et al., "SiGe-on-Insulator (SGOI): Substrate Preparation and MOSFET Fabrication for Electron Mobility Evaluation (and conference outline)", IEEE International SOI Conference, Oct. 2001, United States, pp. 13-14 and 3 page outline.
Cheong et al., "Investigation of Ultralow Leakage in MOS Capacitors on 4H SiC", IEEE Transactions on Electron Devices, vol. 51(9), Sep. 2004, United States, pp. 1361-1365.
Cho et al., "A Novel Capacitor-Less DRAM Cell Using Thin Capacitively-Coupled Thyristor (TCCT)", IEEE, 2005, United States, 4 pages.
Current et al., "Atomic-Layer Cleaving with SixGey Strain Layers for Fabrication of Si and Ge-Rich SOI Device Layers", IEEE International SOI Conference, Oct. 2001, United States, pp. 11-12.
Dimitraiadis et al., "New a-SiC, Optically Controlled, Thyristor-Like Switch", Electronics Letters, vol. 28(17), Aug. 13, 1992, United Kingdom, pp. 1622-1624.
Ernst et al., "Fabrication of a Novel Strained SiGe:C-channel Planar 55 nm nMOSFET for High-Performance CMOS", Digest of Technical Papers—Symposium on VLSI Technology, 2002, United States, pp. 92-93.
Feder, "I.B.M. Finds Way to Speed Up Chips", The New York Times, Jun. 8, 2001, reprinted from http://www.nytimes.com/2001/06/08/technology/08BLUE.html, 2 pages.
Garone et al., "Mobility Enhancement and Quantum Mechanical Modeling in GexSi1-x Channel MOSFETs from 90 to 300K", IEEE Electron Devices Meetins, 1991, United States, pp. 29-32.
Gu et al., "High Performance Sub-100 nm Si Thin-Film Transistors by Pattern-Controlled Crystallization of Thin Channel Layer and High Temperature Annealing", Device Research Conference Digest, 2002, United States, pp. 49-50.
Hara et al., "High Performance Poly-Si TFTs on a Glass by a Stable Scanning CW Laser Lateral Crystallization", IEEE Electron Devices Meeting, 2001, United States, pp. 747-750.
Hara et al., "Selective Single-Crysralline-Silicon Growth at the Pre-Defined Active Regions of TFTs on a Glass by a Scanning CW Layer Irradiation", IEEE Electron Devices Meeting, 2000, United States, pp. 209-212.
Huang et al., "Carrier Mobility Enhancement in Strained SI-on-Insulator Fabricated by Wafer Bonding", Digest of Technical Papers—Symposium on VLSI Technology, 2001, United States, pp. 57-58.
Jager et al., "Single Grain Thin-Fim-Transistor (TFT) with SOI CMOS Performance Formed by Metal-Induced-Lateral-Crystallization", IEEE Electron Devices Meeting, 1999, United States, pp. 293-296.
Jen et al., "Electrical and Luminescent Characteristics of a-SIC:H P-I-N Thin-Film LED's with Graded-Gap Junctions", IEEE Transactions on Electron Devices, vol. 44(4), Apr. 1997, United States, pp. 565-571.
Jeon et al., "A New Poly-Si TFT with Selectively Doped Channel Fabricated by Novel Excimer Laser Annealing", IEEE Electron Devices Meeting, 2000, United States, pp. 213-216.
Kesan et al., "High Performance 0.25 μm p-MOSFETs with Silicon-Germanium Channels for 300K and 77K Operation", IEEE Electron Devices Meeting, 1991, United States, pp. 25-28.
Kim et al., "A New High-Performance Poly-Si TFT by Simple Exclmer Laser Annealing on Selectively Floating a-Si Layer", IEEE Electron Devices Meeting, 2001, United States, pp. 751-754.
King et al, "A Low-Temperature (<550°C) Silicon-Germanium MOS Thin-Film Transistor Technology for Large-Area Electronics", IEEE Electron Devices Meeting, 1991, United States, pp. 567-570.
Kuriyama et al., "High Mobility Poly-Si TFT by a New Excimer Laser Annealing Method for Large Area Electronics", IEEE Electron Devices Meeting, 1991, United States, pp. 563-566.
Li et al., "Design of High Speed Si/SiGe Heterojunction Complementary MOSFETs with Reduced Short-Channel Effects", National Central University, ChungLi, Taiwan, ROC, Aug. 2001, Contract No. NSC 89-2215-E-008-049, National Science Council of Taiwan, pp. 1 and 9.
Lu et al., "A Buried-Trench DRAM Cell Using a Self-Aligned Epitaxy Over Trench Technology", IEEE Electron Devices Meeting, 1988, United States, pp. 588-591.
Markoff, "I.B.M. Circuits are Now Faster and Reduce Use of Power", The New York Times, Feb. 25, 2002, reprinted Mar. 20, 2002, online http://story.news.yahoo.com/ news?tmpl=story&u=/nyt/200220225/.../i_b_m_circuits_are_now_faster_and_reduce_use_of_power, 1 page.
Mizuno et al., "High Performance CMOS Operation of Strained-SOI MOSFETs Using Thin Film SiGe-on-Insulator Substrate", Digest of Technical Papers—Symposium on VLSI Technology, 2002, United States, pp. 106-107.
Myers et al., "Deuterium Interactions in Oxygen-Implanted Copper", Journal of Applied Physics vol. 65(1), Jan. 1, 1989, United States, pp. 311-321.
Nayfeh et al., "Electron Inversion Layer Mobility in Strained-Si n-MOSFET's with High Channel Doping Concentration Achieved by Ion Implantation", Device Research Conference Digest, 2002, United States, pp. 43-44.
Nemati et al., "A Novel High Density, Low Voltage SRAM Cell with a Vertical NDR Device", IEEE, 1998, United States, 2 pages.
Ono et al., "Analysis of Current-Voltage Characteristics in Polysilicon TFTs for LCDs". IEEE Electron Devices Meeting, 1988, United States, pp. 256-259.
Park et al., "Normal Incident SiGe/Si Multiple Quantum Well Infrared Detector", IEEE Electron Devices Meeting, 1991, United States, pp. 749-752.
Powell et al., "SiC Materials—Progress, Status, and Potential Roadblocks", Proceedings of the IEEE vol. 90(6), Jun. 2002, United States, pp. 942-955.
Rim et al., "Characteristics and Device Design of Sub-100 nm Strained SiN- and PMOSFETs", Digest of Technical Papers—Symposium on VLSI Technology, 2002, United States, pp. 98-99.
Rim et al., "Strained Si NMOSFET's for High Performance CMOS Technology", Digest of Technical Papers—Symposium on VLSI Technology, 2001, United States, pp. 59-60.
Saggio et al., "Innovative Localized Lifetime Control in High-Speed IGBT's", IEEE Electron Device Letters vol. 18, No. 7, Jul. 1997, United States, pp. 333-335.
Sasago et al., "Cross-point phase change memory with 4F2 cell size driven by low-contract-resistivity 1 poly-Si diode", Digest of Technical Papers—Symposium on VLSI Technology, 2009, United States, pp. 24-25.
Shima et al., "<100> Channel Strained-SiGe p-MOSFET with Enhanced Hole Mobility and Lower Parasitic Resistance", Digest of Technical Papers—Symposium on VLSI Technology, 2002, United States, pp. 94-95.
Sugizaki et al., "35-nm Gate-Length and Ultra Low-voltage (0.45 V) Operation Bulk Thyristor-SRAMIDRAM (BT-RAM) Cell with the Triple Selective Epitaxy Layers (TELs)", Digest of Technical Papers—Symposium on VLSI Technolgy, 2008, United States, 1 page (abstract).
Suliman et al., "Gate-Oxide Grown on the Sidewalls and Base of aU-Shaped Si Trench: Effects of the Oxide and Oxide/Si Interface Condition on the Properties of Vertical MOS Devices", Microelectronic Engineering vol. 72, 2004, Netherlands, pp. 247-252.
Takagi, "Strained-Si- and SiGe-on-Insulator (Strained SOI and SGOI) MOSFETs for High Performance/Low Power CMOS Application", Device Research Conference Digest, 2002, United States, pp. 37-40.
Tezuka et al., "High-Performance Strained Si-on-Insulator MOSFETs by Novel Fabrication Processes Utilizing Ge-Condensation Technique", Digest of Technical Papers—Symposium on VLSI Technology, 2002, United States, pp. 96-97.
Tzeng et al., "Dry Etching of Silicon Materials in SF6 Based Plasmas", Journal of The Electrochemical Society vol. 134, Issue 9, 1987, United States, pp. 2304-2309.

(56) References Cited

OTHER PUBLICATIONS

Van Meer et al., "Ultra-Thin Film Fully-Depleted SOI CMOS with Raised G/S/D Device Architecture for Sub-100 nm Applications", IEEE International SOI Conference, Oct. 2001, United States, pp. 45-46.

Xie et al., "A Vertically Integrated Bipolar Storage Cell in 6H Silicon Carbide for Nonvolatile Memory Applications", IEEE Electron Device Letters vol. 15(6), Jun. 1994, United States, pp. 212-214.

Yamada et al., "Spread Source/Drain (SSD) MOSFET Using Selective Silicon Growth for 64Mbit DRAMs", IEEE Electron Devices Meeting, 1989, United States, pp. 35-38.

Yamauchi et al., "Drastically Improved Performance in Poly-Si TFTs with Channel Dimensions Comparable to Grain Size", IEEE Electron Devices Meeting, 1989, United States, pp. 353-356.

Yang et al., "High Performance CMOS Fabricated on Hybrid Substrate with Different Crystal Orientations", IEEE Electron Devices Meeting, 2003, United States, pp. 453-456.

Yu et al., "Low-Temperature Titanium-Based Wafer Bonding", Journal of the Electrocheical Society vol. 154, No. 1, 2007, United States, pp. H20-H25.

\* cited by examiner

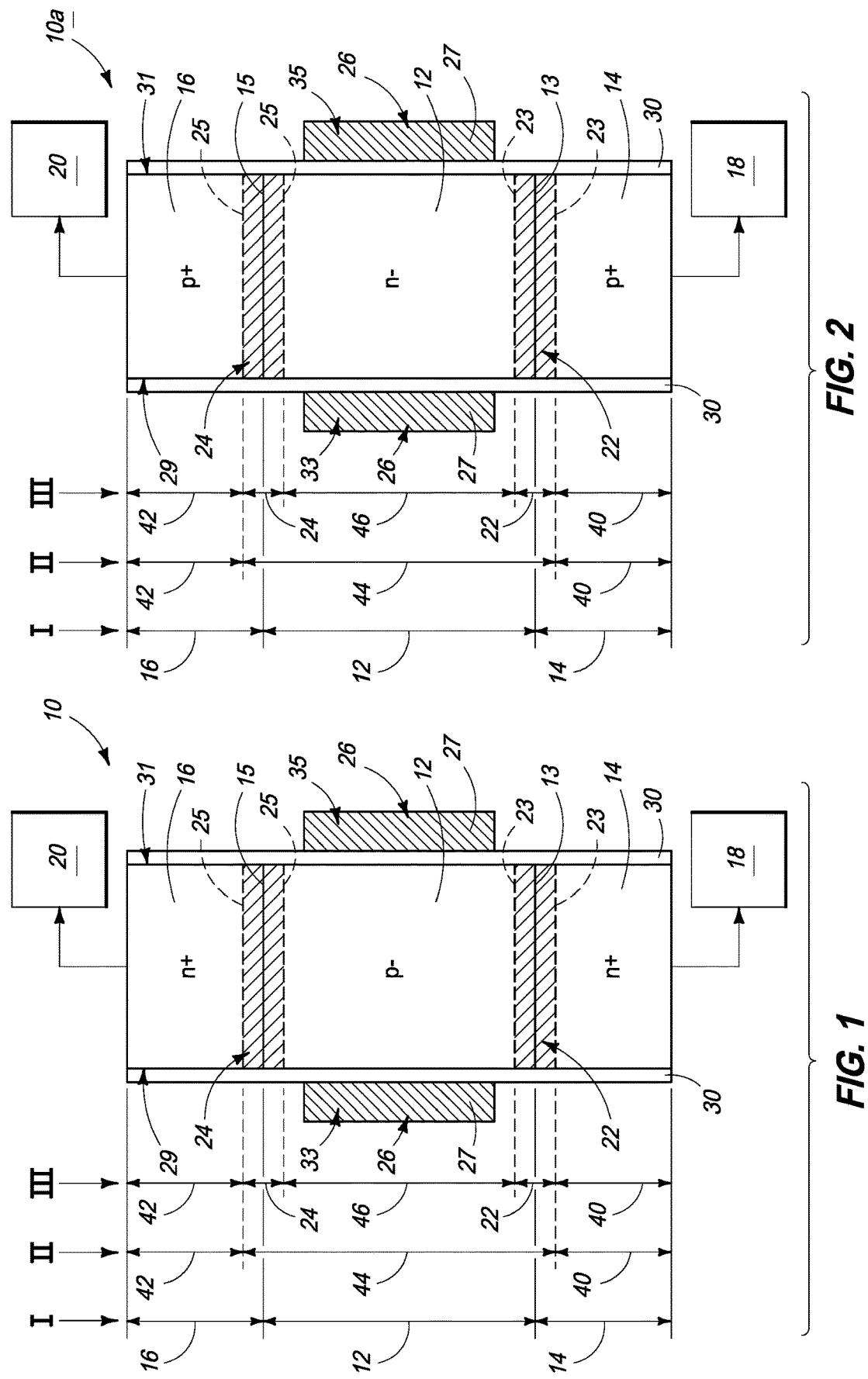

GATED BIPOLAR JUNCTION TRANSISTORS, MEMORY ARRAYS, AND METHODS OF FORMING GATED BIPOLAR JUNCTION TRANSISTORS

RELATED PATENT DATA

This patent resulted from a divisional of U.S. patent application Ser. No. 14/613,876 which was filed Feb. 4, 2015, which is a divisional of U.S. patent application Ser. No. 13/037,642 which was filed Mar. 1, 2011, each of which is hereby incorporated by reference.

TECHNICAL FIELD

Gated bipolar junction transistors, memory arrays, and methods of forming gated bipolar junction transistors.

BACKGROUND

Memory is one type of integrated circuitry, and is used in computer systems for storing data. Integrated memory is usually fabricated in one or more arrays of individual memory cells. The memory cells might be volatile, semi-volatile, or nonvolatile. Nonvolatile memory cells can store data for extended periods of time, and in some instances can store data in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds, or less.

The memory cells are configured to retain or store memory in at least two different selectable states. In a binary system, the states are considered as either a "0" or a "1". In other systems, at least some individual memory cells may be configured to store more than two levels or states of information.

Nonvolatile memory may be used in applications in which it is desired to retain data in the absence of power. Nonvolatile memory may also be used in applications in which power is a limited resource (such as in battery-operated devices) as an alternative to volatile memory because non-volatile memory may have the advantage that it can conserve power relative to volatile memory. However, read/write characteristics of nonvolatile memory may be relatively slow in comparison to volatile memory, and/or nonvolatile memory may have limited endurance (for instance, nonvolatile memory may only function for about $10^5$ read/write cycles before failure). Thus, volatile memory is still often used, even in devices having limited reserves of power. It would be desirable to develop improved nonvolatile memory and/or improved semi-volatile memory. It would be further desirable to develop memory cells that are nonvolatile or semi-volatile, while having suitable read/write characteristics and endurance to replace conventional volatile memory in some applications.

Integrated circuitry fabrication continues to strive to produce smaller and denser integrated circuits. It can be desired to develop small-footprint memory cells in order to conserve the valuable real estate of an integrated circuit chip. For instance, it can be desired to develop memory cells that have a footprint of less than or equal to $4F^2$, where "F" is the minimum dimension of masking features utilized to form the memory cells.

It would be desirable to develop new memory cells which can be non-volatile or semi-volatile, and which have may have a footprint approaching $4F^2$.

BRIEF DESCRIPTION OF THE DRAWINGS

FIG. 1 is a diagrammatic cross-sectional view of an example embodiment memory cell.

FIG. 2 is a diagrammatic cross-sectional view of another example embodiment memory cell.

DETAILED DESCRIPTION OF THE ILLUSTRATED EMBODIMENTS

Figure 4:
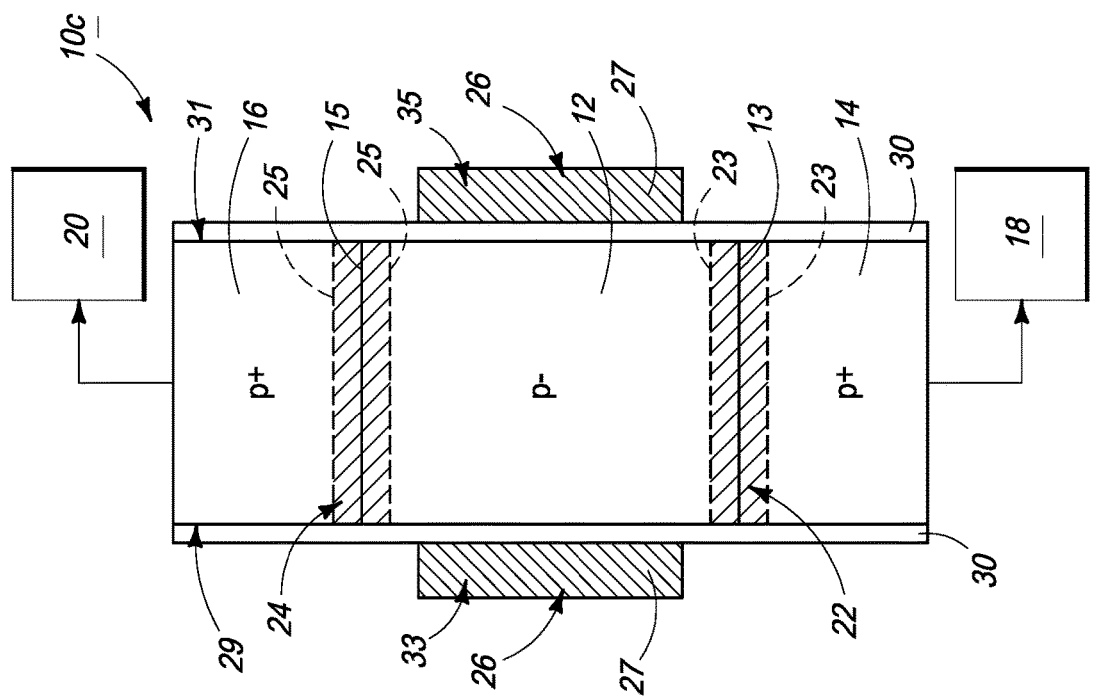
FIG. 4 is a diagrammatic cross-sectional view of another example embodiment memory cell.

Some embodiments include memory cells comprising one or more wide-bandgap materials; with a "wide-bandgap material" being a material having a bandgap measurably greater than the 1.12 eV bandgap of silicon at 300 K. In some embodiments, the wide-bandgap material may have a bandgap of 1.2 eV or greater. In some embodiments, the wide-bandgap material may have a bandgap of 2.3 eV or greater, and may, for example, comprise one or more forms of silicon carbide.

The memory cells may be gated bipolar junction transistors (BJTs), and may comprise electrically floating bodies. In some embodiments, the wide-bandgap material may be utilized in the floating bodies and/or in depletion regions adjacent the floating bodies. Such utilization of the wide-bandgap material may enable formation of random access memory (RAM) having longer retention time than conventional dynamic random access memory (DRAM), while also having suitably fast read/write characteristics to substitute for conventional DRAM in some applications. Additionally, or alternatively, the wide-bandgap material may enable formation of memory having retention times of several years, and thus may enable formation of nonvolatile memory. In some embodiments, the nonvolatile memory may have endurance approaching, or even exceeding, the endurance of conventional DRAM (such as endurance suitable to survive $10^6$ or more read/write cycles).

Example gated BJT memory cells are described with reference to FIGS. 1-4.

Referring to FIG. 1, a memory cell 10 comprises a base region 12 between a pair of emitter/collector regions 14 and 16. The regions 12, 14 and 16 may be comprised by a pillar-type structure in some embodiments, and such structure may be referred to as a BJT pillar.

The emitter/collector region 14 interfaces with the base region 12 at a junction 13, and similarly the emitter/collector region 16 interfaces with the base region 12 at a junction 15. In operation, one of the emitter/collector regions will be the emitter region of the BJT device, and the other will be the collector region of the device. The junction between the base region and the emitter region may be referred to as a B-E junction, and the junction between the base region and the collector region may be referred to as a B-C junction.

The emitter/collector regions 14 and 16 are shown to be electrically coupled to electrical nodes 18 and 20, respectively. One of the nodes 18 and 20 may correspond to a bitline (i.e., a digit line or sense line). The other of the nodes 18 and 20 may correspond to a wordline (i.e., an access line) in some embodiments, or to a ground or other electrically static structure in other embodiments.

Figure 3:
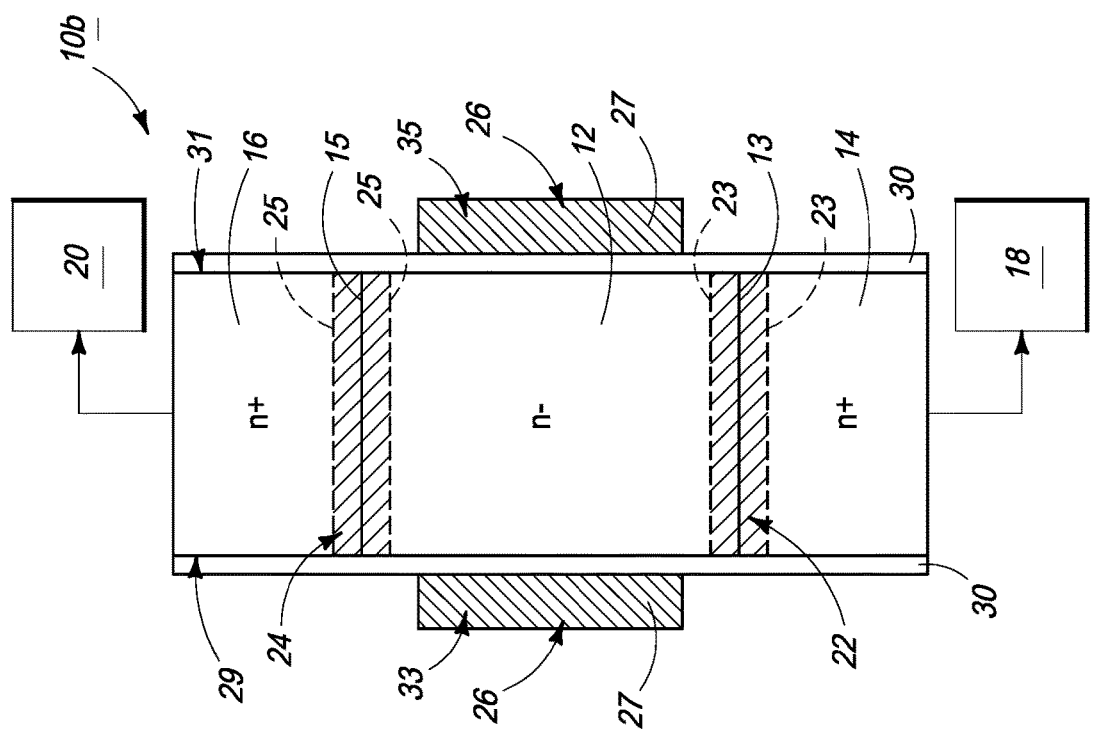
FIG. 3 is a diagrammatic cross-sectional view of another example embodiment memory cell.

The illustrated BJT of memory cell 10 has the base oppositely doped to the emitter/collector regions; and specifically comprises a p-type base and n-type emitter/collector regions. In other embodiments, the base region and emitter/collector regions may comprise other doping arrangements, as illustrated in FIGS. 2-4.

The symbols "+" and "−" are utilized in FIG. 1 (and various other figures of this disclosure) to indicate dopant levels. Some or all of the designations p+, p, p−, n−, n and n+ may be used to indicate various levels and types of doping. The difference in dopant concentration between the regions identified as being p+, p, and p− may vary depending on the particular material being doped. An example dopant concentration of a p+ region is a dopant concentration of at least about $10^{19}$ atoms/cm$^3$ (and in some example applications may be from about $10^{19}$ atoms/cm$^3$ to about $10^{20}$ atoms/cm$^3$), an example dopant concentration of a p region is from about $10^{18}$ to about $10^{19}$ atoms/cm$^3$, and an example dopant concentration of a p− region is less than about $5 \times 10^{18}$ atoms/cm$^3$ (and in some embodiments may be less than or equal to about $5 \times 10^{17}$ atoms/cm$^3$). The regions identified as being n−, n and n+ may have dopant concentrations similar to those described above relative to the p−, p and p+ regions, respectively.

It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the terms "p-type doped" and n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

The dopants utilized in memory cell 10 may be any suitable dopants. In some embodiments, at least part of the memory cell will comprise wide-bandgap material. An example wide-bandgap material is silicon carbide, and such may be n-type doped with, for example, one or more of N (such as from $N_2$ and/or $NH_3$), P (such as from $PH_3$) and As (such as from $AsH_3$). Alternatively, the silicon carbide may be p-type doped with, for example, one or more of B (such as from $B_2H_6$), Al (such as from $AlCl_3$, trimethylaluminum and triethylaluminum) and Ga (such as from trimethylgallium).

In operation, depletion regions 22 and 24 may be induced between base region 12 and the emitter/collector regions 14 and 16, respectively. The depletion regions are diagrammatically illustrated with cross-hatching. Approximate boundaries of the depletion region 22 are illustrated with dashed lines 23, and approximate boundaries of the depletion region 24 are illustrated with dashed lines 25.

The memory cell 10 has a gate 26 along the base region 12. In operation, the base region may comprise an electrically floating body of the memory cell. The gate may be used to enable charge to be selectively stored on such floating body, or to be drained from the floating body. Thus, the memory cell may have two selectable memory states, with one of the states having more charge stored on base region 12 than the other state.

The illustrated BJT is configured as a vertical pillar having a pair of opposing sidewalls 29 and 31, and the gate 26 is shown to be bifurcated into a pair of segments 33 and 35, with each segment being along one of the opposing sidewalls. In some embodiments, the illustrated memory cell may be one of a plurality of memory cells of a memory array, and the illustrated segments 33 and 35 of the gate may correspond to a pair of lines that extend along multiple memory cells of a row or column of the array to interconnect multiple memory cells. Such lines would extend in and out of the page relative to the cross-sectional view of FIG. 1. The segments 33 and 35 may join with one another at some location outside of the view of FIG. 1 so that the illustrated segments 33 and 35 are actually two parts of the same gate.

The gate 26 comprises a material 27. Such material may comprise any suitable substance, and may, for example, comprise one or more of various metals (for instance, titanium, tungsten, etc.), metal-containing compositions (for instance, metal silicide, metal nitride, etc.), and conductively-doped semiconductor materials (for instance, conductively-doped silicon, conducted-doped geranium, etc.).

The gate 26 is spaced from the sidewalls 29 and 31 of the BJT pillar by dielectric material 30. The dielectric material may comprise any suitable composition or combination of compositions. In some embodiments, at least a portion of the BJT pillar comprises one or more forms of silicon carbide, and at least a portion of the dielectric material 30 that is directly against the silicon carbide comprises a passivation composition containing silicon, oxygen and nitrogen. Such passivation composition may be formed by chemically reacting a surface of the silicon carbide with oxygen and nitrogen, and/or by depositing a composition containing silicon, oxygen and nitrogen along the surface of the silicon carbide.

In some embodiments, an entirety of dielectric material 30 may comprise the passivation composition containing silicon, oxygen and nitrogen. In other embodiments, the dielectric material 30 may comprise two or more different compositions, with the composition directly against surfaces of the BJT pillar being the passivation material, and with one or more other compositions being between the passivation material and the gate 26. Such other compositions may comprise, for example, one or both of silicon dioxide and silicon nitride.

In the shown embodiment, the gate 26 is along base region 12 of the BJT, but does not overlap the B-C and B-E junctions 13 and 15. Further, the gate does not overlap the depletion regions 22 and 24 during operation of the BJT. In the shown configuration in which the BJT is within a vertical pillar, the gate 26 may be considered to vertically overlap the base region, and to not vertically overlap the depletion regions 22 and 24.

It can be advantageous for gate 26 to not overlap depletion regions 22 and 24 in that such can alleviate or eliminate a source of leakage within the memory cell. Specifically, a gated BJT memory cell may have primary leakage mechanisms that include gate-induced leakage (which may be referred to as gate-induced-drain-leakage, i.e., GIDL), base/emitter junction leakage, and base/collector junction leakage. If the gate 26 overlaps the depletion regions, then a significant leakage mechanism within the memory cell may be gate-induced leakage, and such may be a much larger contribution to the leakage within the memory cell than the combination of intrinsic base/emitter junction leakage and intrinsic base/collector junction leakage. In the shown example embodiment of FIG. 1, the gate does not overlap the depletion regions, and thus only couples with the base region. Accordingly, the gate-induced leakage, if any, may be a small contribution to the overall leakage within the memory cell; and thus the overall leakage through the memory cell may be limited to the intrinsic leakage of the two junctions. This can enable the memory cell of FIG. 1 to have much longer retention times than conventional DRAM, and in some embodiments to have retention times suitable for utilization in nonvolatile memory.

The BJT pillar of memory cell 10 may be considered to be subdivided into numerous regions, as explained with reference to the scales I, II and III shown in FIG. 1.

Scale I illustrates that the BJT pillar may be considered to comprise a first emitter/collector region 14, a base region 12, and a second emitter/collector region 16. The regions 12 and 14 interface at the junction 13, and the regions 12 and 16 interface at the junction 15.

Scale II illustrates that the BJT pillar may be considered to comprise a first outer region 40 corresponding to the portion of the emitter/collector region 14 that is outward of the depletion region 22, a second outer region 42 corresponding to the portion of the emitter/collector region 16 that is outward of the depletion region 24, and an inner region 44 between the outer regions 40 and 42. The inner region 44 interfaces with outer region 40 at an outermost edge of depletion region 22, and interfaces with outer region 42 at an outermost edge of depletion region 24.

Scale III illustrates that the BJT pillar may be considered to comprise the outer regions 40 and 42, the depletion regions 22 and 24, and a neutral base region (or floating body region) 46 between the depletion regions.

As discussed above, the BJT pillar may comprise one or more wide-bandgap materials. The wide-bandgap materials may advantageously improve retention time of the memory cell relative to narrower-bandgap materials (such as silicon) by reducing leakage within the memory cell. In some embodiments, wide-bandgap material is provided at least across the junctions 13 and 15 in wide enough expanses to fully encompass depletion regions 22 and 24. Thus, the wide-bandgap material is provided across the locations where the wide-bandgap material may reduce base/collector junction leakage and base/emitter junction leakage. In some embodiments, the wide-bandgap material may be provided as strips extending across depletion regions 22 and 24, and thus the regions 40, 46 and 42 of scale III may be narrow-bandgap materials (such as silicon). In such embodiments, the wide-bandgap material across depletion region 22 may be the same composition as the wide-bandgap material across depletion region 24, or may be a different composition to tailor the BJT for a particular application of the memory cell 10.

Possible means by which the wide bandgap materials may reduce leakage within the BJT are as follows. Intrinsic leakage may be considered to be derived through two different mechanisms, and to approximately correspond to whichever of the mechanisms predominates. One of the mechanisms is generation of intrinsic carriers in depletion regions, and the other is diffusion of intrinsic carriers in the neutral regions. The concentration of intrinsic carriers ($n_i$) may be represented by Equation I:

$$n_i = e^{\left(\frac{-E_g}{2kT}\right)} \quad \text{Equation I}$$

In Equation I, $E_g$ is the bandgap, T is temperature, and k is Boltzmann's constant. Intrinsic leakage will be approximately proportional to $n_i$ for a leakage mechanism corresponding to generation of intrinsic carriers in depletion regions, and will be approximately proportional to $(n_i)^2$ (i.e., the squared concentration of intrinsic carriers) for a leakage mechanism corresponding to diffusion of intrinsic carriers in neutral regions. In either event, an increase in bandgap exponentially reduces $n_i$, and thus exponentially reduces leakage. Further, since the leakage mechanism corresponding to diffusion of intrinsic carriers in neutral regions is proportional to $(n_i)^2$, while the leakage mechanism corresponding to generation of intrinsic carriers in depletion regions is proportional to $n_i$, the leakage mechanism corresponding to diffusion of intrinsic carriers in neutral regions reduces very quickly with increasing bandgap so that the leakage mechanism corresponding to generation of intrinsic carriers in depletion regions is the predominant leakage mechanism for wide-bandgap materials.

The reduction in leakage obtained utilizing wide-bandgap materials may be enormous. For instance, substitution of silicon carbide with a crystalline structure polytype of three-bilayer periodicity with cubic crystal symmetry (3C-SiC (bandgap 2.52 eV)) for silicon (bandgap 1.12 eV) may decrease $n_i$ by about 10 orders of magnitude (i.e., $10^{10}$) at 85° C. Retention may be directly proportional to leakage (all other things being equal), and thus a memory cell utilizing 3C-SiC may have 10 orders of magnitude better retention than an analogous memory cell utilizing silicon. In some embodiments, a memory cell utilizing 3C-SiC may have a retention time of at least about 10 years, or even at least about 20 years.

The wide-bandgap materials may be provided anywhere in the BJT pillar where leakage may be problematic. For instance, it may be advantageous to provide wide-bandgap material across the region 40 of scale III when such region corresponds to an emitter region of the BJT (such as, for example, if the BJT is an npn BJT, the node 20 is a bitline, and the memory cell is operated in accordance with methodology described below with reference to FIGS. 5 and 6). In such embodiments, the wide-bandgap material across region 40 may be the same or different than the wide-bandgap material across one or both of the depletion regions 22 and 24. It may also be advantageous to provide wide-bandgap material within the regions 42 and 46 of scale III either to prevent leakage, or to simplify fabrication of memory cell 10 in embodiments in which wide-bandgap material as provided within depletion regions 22 and 24. Accordingly, in some embodiments wide-bandgap material is provided across all of the regions 40, 22, 46, 24 and 42 of scale III. In such embodiments, the same wide-bandgap material may be provided across all of the regions 40, 22, 46, 24 and 42 so that the entirety of the vertical BJT pillar comprises, consists essentially of, or consists of only one wide-bandgap material. In other embodiments, one or more of the regions 40, 22, 46, 24 and 42 may comprise a different wide-bandgap material than another region to tailor the memory cell 10 for a particular application.

In some embodiments, wide-bandgap material may be provided across region 44 of scale II to extend across the base region 12 and the depletion regions 22 and 24. In such embodiments, the wide-bandgap material may also extend across one or both of the regions 40 and 42 of the scale II. For instance, it may be advantageous for the wide-bandgap material to extend across region 40 if region 40 is an emitter region of the BJT. Further, it may be advantageous for the wide-bandgap material to extend across region 42, either to alleviate a leakage mechanism, or to simplify fabrication of the memory cell having the wide-bandgap material in region 44. If wide-bandgap material extends across one or both of regions 40 and 42, in addition to region 44, the material may be the same across all of the regions 40, 44 and 42, or may differ in one or both of the regions 40 and 42 relative to region 44 to tailor the memory cell 10 for a particular application.

The wide-bandgap material may comprise any suitable composition. In some embodiments, the wide-bandgap material may comprise silicon and carbon, and may comprise one or more forms of silicon carbide. For instance, the wide-bandgap material may comprise, consist essentially of, or consist of the 3C form of silicon carbide in some embodiments, and thus may have a bandgap greater than 2.3 eV (specifically, such form of SiC has a bandgap of 2.36 eV).

FIG. 2 shows an example embodiment memory cell 10a analogous to the memory cell 10 of FIG. 1, but comprising a pnp BJT rather than an npn BJT. The memory cell 10a of FIG. 2 is labeled with identical numbering to that used above to describe FIG. 1, and comprises identical features as the memory cell of FIG. 1 except for the different dopant type utilized in the base and emitter/collector regions.

FIGS. 3 and 4 show example embodiment memory cells 10b and 10c, respectively. The memory cells 10b and 10c are analogous to the memory cell 10 of FIG. 1, but comprise a same conductivity type throughout the base 12 and the emitter/collector regions 14 and 16. The dopant level in the base region is, however, less than the dopant levels in the base/collector regions. The memory cells 10b and 10c of FIGS. 3 and 4 are labeled with identical numbering to that used above to describe FIG. 1, and comprise identical features as the memory cell of FIG. 1 except for the dopant types utilized in the base and emitter/collector regions. The junctions 13 and 15 of FIGS. 3 and 4 differ from those of FIG. 1 in that they are interfaces where different dopant levels meet, rather than being interfaces where different dopant types meet. In operation, the gates 26 of the memory cells 10b and 10c may electrically induce a change in dopant type within the base regions coupled to such gates so that the BJTs of the memory cells function as npn and pnp BJTs, respectively, even though the BJTs are not initially doped as npn or pnp BJTs.

Figure 5:
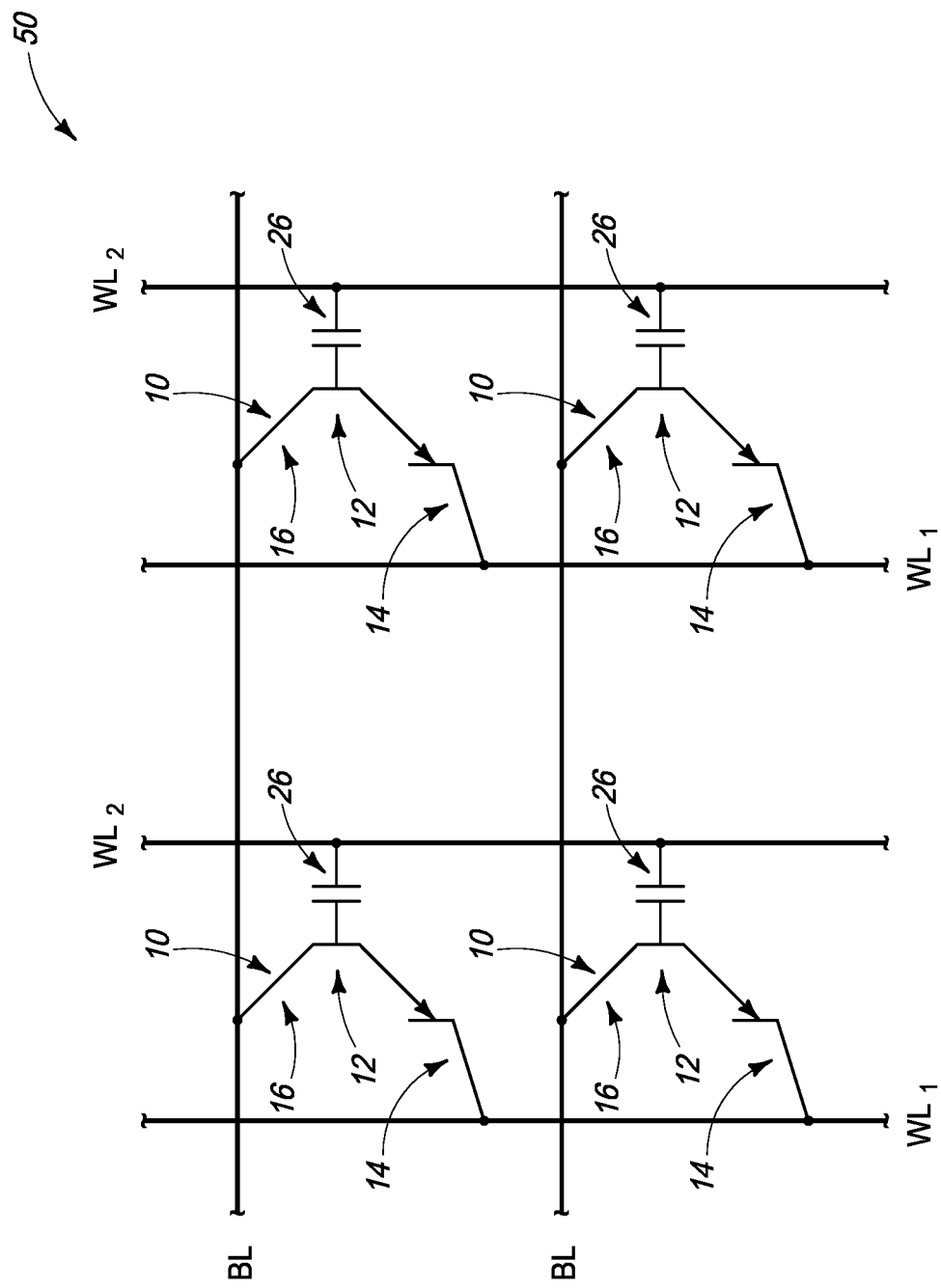
FIG. 5 is a diagrammatic schematic view of an example embodiment memory array comprising memory cells of the type shown in FIG. 1.

The memory cells of FIGS. 1-4 may be utilized in memory arrays. FIG. 5 diagrammatically illustrates a memory array 50 comprising a plurality of memory cells 10 of the type described above with reference to FIG. 1. Each memory cell is schematically illustrated as a gated BJT, with the gate 26 illustrated to be capacitively coupled to the base 12 (the capacitive coupling is through the dielectric 30, which is not shown in FIG. 5). The illustrated BJTs of FIG. 5 have the region 14 as the emitter region and the region 16 as the collector region, but such orientation may be reversed in other embodiments.

The memory array 50 comprises a series of bitlines, a first series of wordlines (the series identified as $WL_1$), and a second series of wordlines (the series identified as $WL_2$). In some embodiments, the node 20 of FIG. 1 may correspond to a bitline (BL), the node 18 of FIG. 1 may correspond to a wordline of the first series ($WL_1$), and the gate 26 of FIG. 1 may be along a wordline of the second series ($WL_2$). In such embodiments, the emitter/collector regions 16 of memory cells 10 may be considered to be first emitter/collector regions which are directly coupled with bitlines, and the emitter/collector regions 14 of the memory cells may be considered to be second emitter/collector regions which are electrically coupled with the first series of wordlines. Each memory cell of array 50 may be uniquely addressed through combinations containing one of the bitlines together with one of the wordlines $WL_2$ and/or one of the wordlines $WL_1$. The wordlines may be alternatively referred to as access lines in some embodiments, and the bitlines may be alternatively referred to as sense lines in some embodiments.

Figure 6:
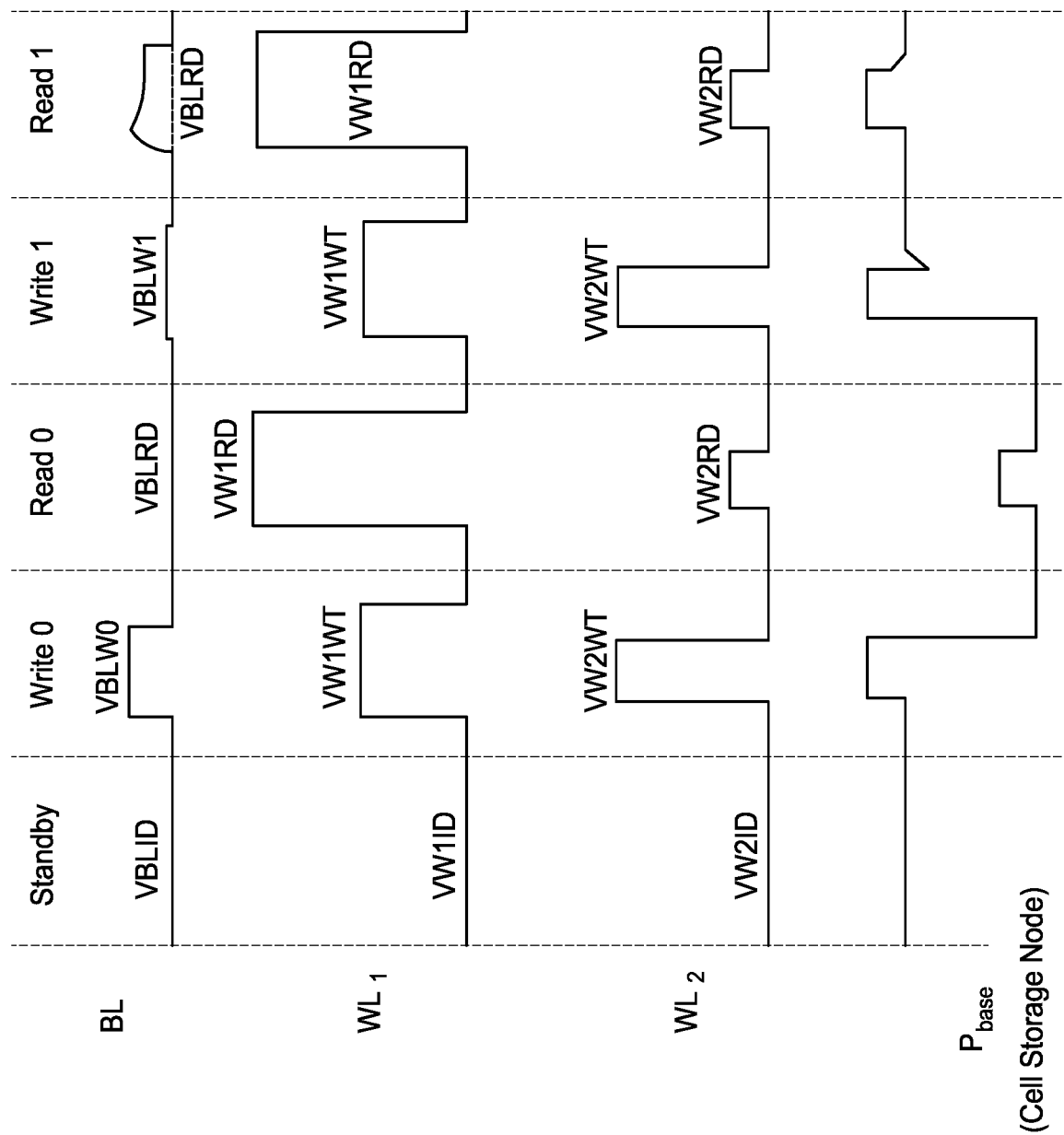
FIG. 6 diagrammatically illustrates an example embodiment operational arrangement for utilizing the memory array of FIG. 5.

FIG. 6 diagrammatically illustrates various operations that may be utilized for programming individual memory cells of the array 50 into a "0" data state (i.e., "write 0" operations), programming the individual memory cells into a "1" data state (i.e., "write 1" operations), and for reading the memory cells to ascertain the data states of the individual memory cells. FIG. 6 also diagrammatically illustrates voltage of the $P_{base}$ (i.e., the base 12 of FIG. 1) during the various operations. Example voltage levels for the various states indicated in FIG. 6 may include (assuming a bandgap of 2.3 eV):

VBLID=0 Volt (V)
VBLW0=2V
VBLRD=0V (D0, 0V; D1, 1V)
VBLW1=0V
VW1ID=0V
VW1WT=3V
VW1RD=5V
VW2ID=−3V
VW2WT=2V
VW2RD=−2V The terms "D0" and "D1" indicate voltages read for the "0" data state and the "1" data state, respectively, of the memory cell. The example operations of FIG. 6 may advantageously achieve a high p-base programming margin (greater than or equal to about 1 V) between the D0 and D1 memory states of the memory cell, which may provide a sufficient charge to enable long retention by the memory cell, and to provide a margin against variation and disturb modes. Also, the various voltages utilized for the reading and writing operations may be kept at relatively low levels (less than or equal to about 5 V) which may enable operation of the memory cell with modest power drain.

Another set of example voltage levels for the various states indicated in FIG. 6 may include (assuming a bandgap of 2.3 eV):
VBLID=0V
VBLW0=3V
VBLRD=0V (D0, 0V; D1, 1V)
VBLW1=0V
VW1ID=0V
VW1WT=5V
VW1RD=5V
VW2ID=−3V
VW2WT=2V
VW2RD=−2V It is noted that the "write 0" operation has a lower voltage differential between WL$_1$ and the bitline than does the "write 1" operation. The lower voltage differential between the bitline and WL$_1$ allows charge to drain from the P$_{base}$, while the higher voltage differential between the bitline and WL$_1$ results in charge being trapped on the P$_{base}$. Various mechanisms may account for such relationship. For instance, high-voltage differentials between the bitline and WL$_1$ during capacitive coupling of the base with gate 26 can lead to impact ionization, a Kirk effect, a Webster effect and/or other mechanisms which limit charge transfer through the BJT, and thus can lead to charge being trapped on the floating base of the BJT. In contrast, low-voltage differentials between the bitline and WL$_1$ during the capacitive coupling of the gate with the base may permit a steady flow of charge through the BJT, and thus may permit charge to be drained from the floating base.

A possible explanation for the reason that the lower voltage differential between the bitline and WL$_1$ allows charge to drain from the P$_{base}$, while the higher voltage differential between the bitline and WL$_1$ results in charge being trapped on the P$_{base}$ is as follows. When the voltage differential is high, there is impact ionization in the collector-base region. This supplies a base current (I$_b$) to the npn bipolar transistor. A collector current (I$_c$) results, which is related to the base current through Equation II.

$$I_c = \beta * I_b \qquad \text{Equation II}$$

In Equation II, β is the npn current gain.

The impact ionization current is equal to α$_n$*I$_c$, where α$_n$ is the impact ionization efficiency; and is a function of electric field divided by voltage. This leads to the relationship of Equation III.

$$I_b = \alpha_n * I_c \qquad \text{Equation III}$$

If (α$_n$*β)>1, the cell latches. Once the cell latches, the gate (26 of FIG. 5) losses control of the P$_{base}$ and cannot couple to it. Hence, even if the gate voltage is brought down, the P$_{base}$ voltage stays high. In contrast, with a low voltage differential the cell does not latch, the gate has good coupling to the P$_{base}$, and pulling the gate voltage down will also pull the P$_{base}$ voltage down.

Figure 7:
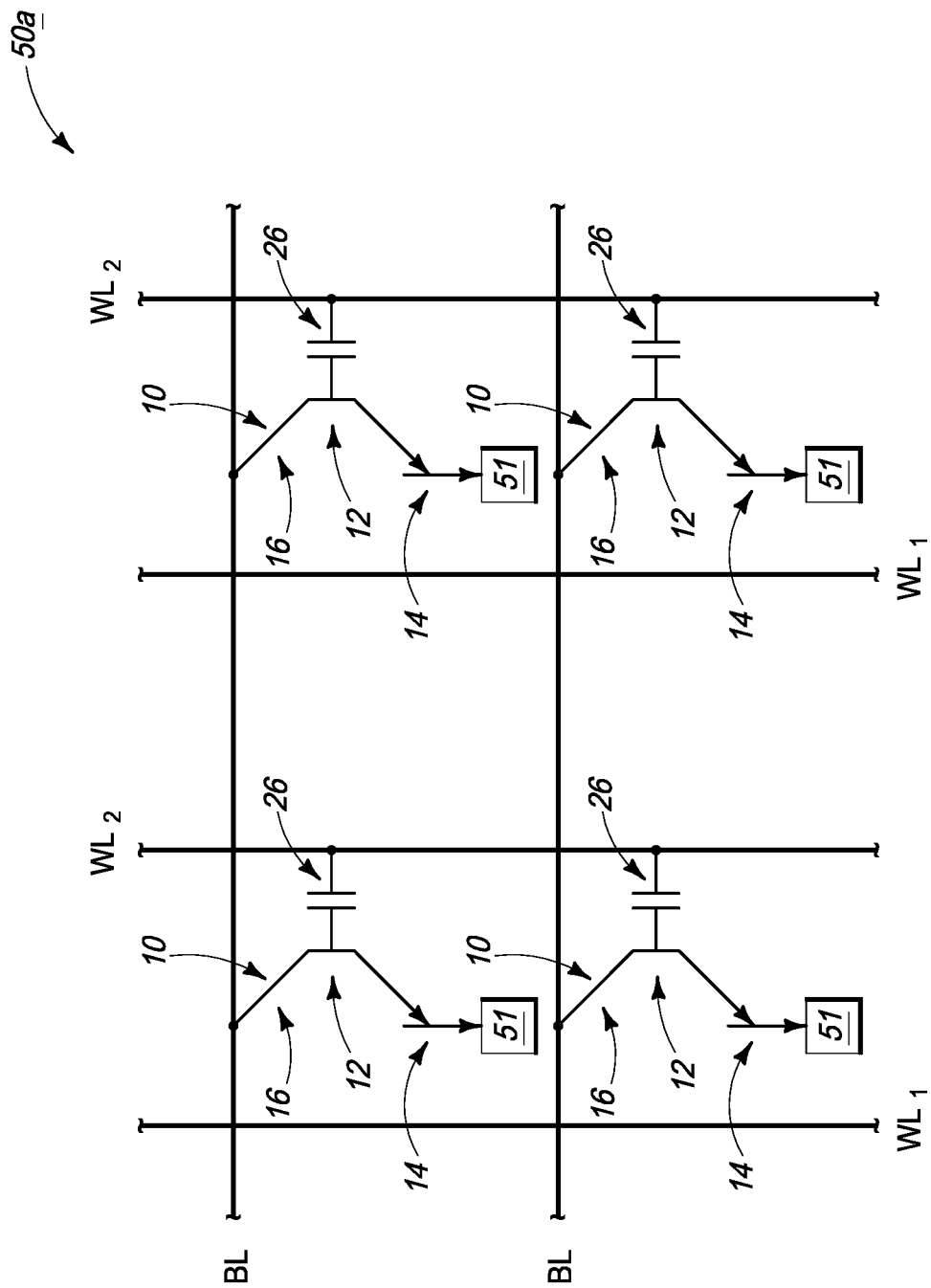
FIG. 7 is a diagrammatic schematic view of another example embodiment memory array comprising memory cells of the type shown in FIG. 1.

FIG. 7 diagrammatically illustrates an example embodiment memory array 50a comprising a plurality of memory cells 10 of the type described above with reference to FIG. 1. The memory array of FIG. 7 is similar to that of FIG. 5, except that the first series of wordlines (WL$_1$ of FIG. 5) has been replaced with nodes 51. The nodes 51 are at a common voltage as one another, and in some embodiments may be electrically coupled with one another and with a common terminal (for instance, they may all be connected to a grounded plate).

In some embodiments, the node 20 of FIG. 1 may correspond to the bitline (BL) of FIG. 7, the node 18 of FIG. 1 may correspond to a node 51, and the gate 26 of FIG. 1 may be along a wordline of the series (WL$_2$). In such embodiments, the emitter/collector regions 16 of memory cells 10 may be considered to be first emitter/collector regions which are directly coupled with bitlines, and the emitter/collector regions 14 of the memory cells may be considered to be second emitter/collector regions which are electrically coupled with one another and with a common terminal. Each memory cell of array 50a may be uniquely addressed through combinations containing one of the bitlines together with one of the wordlines WL$_2$.

Figure 8:
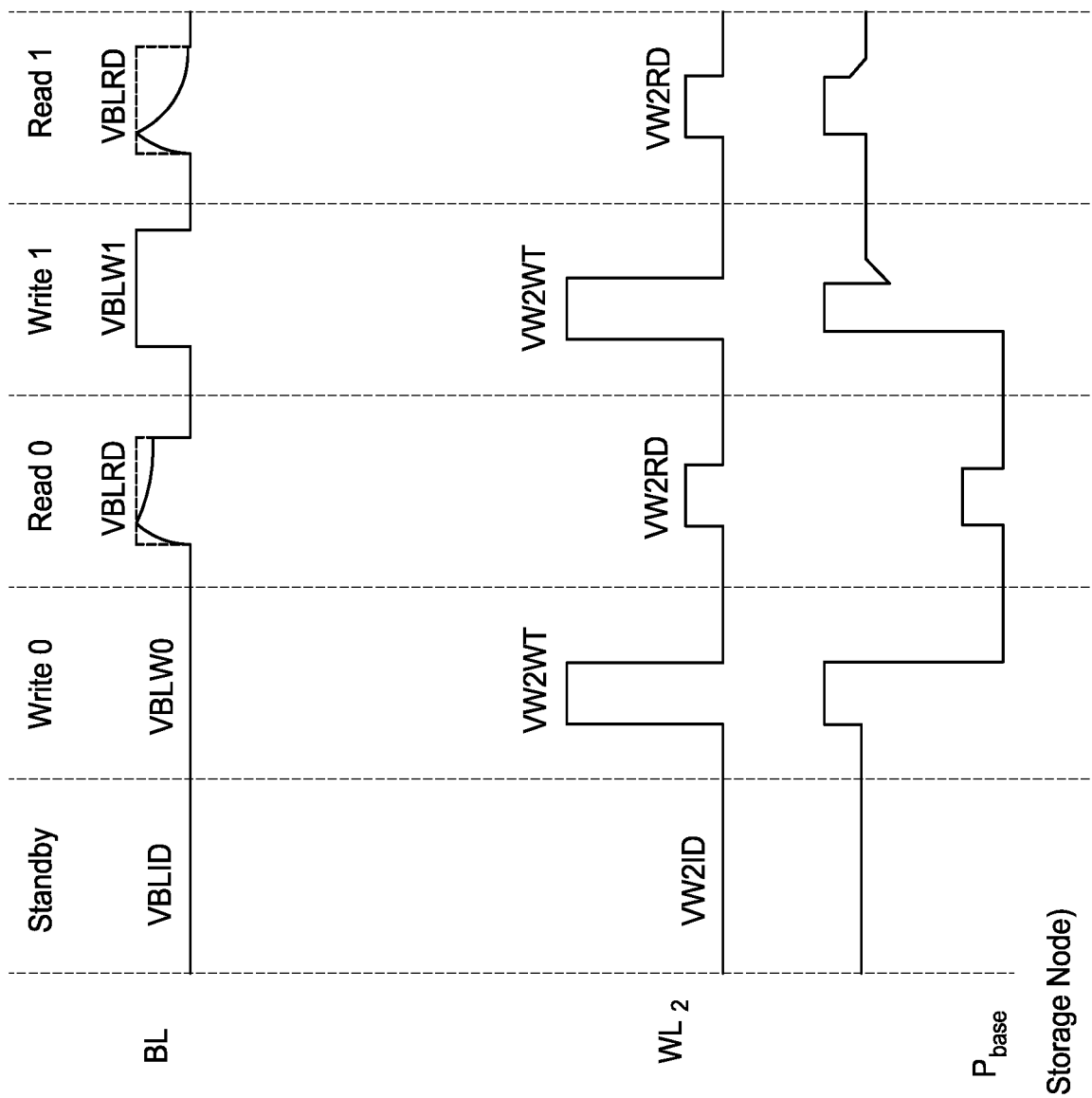
FIG. 8 diagrammatically illustrates an example embodiment operational arrangement for utilizing the memory array of FIG. 7.
Figure 9:
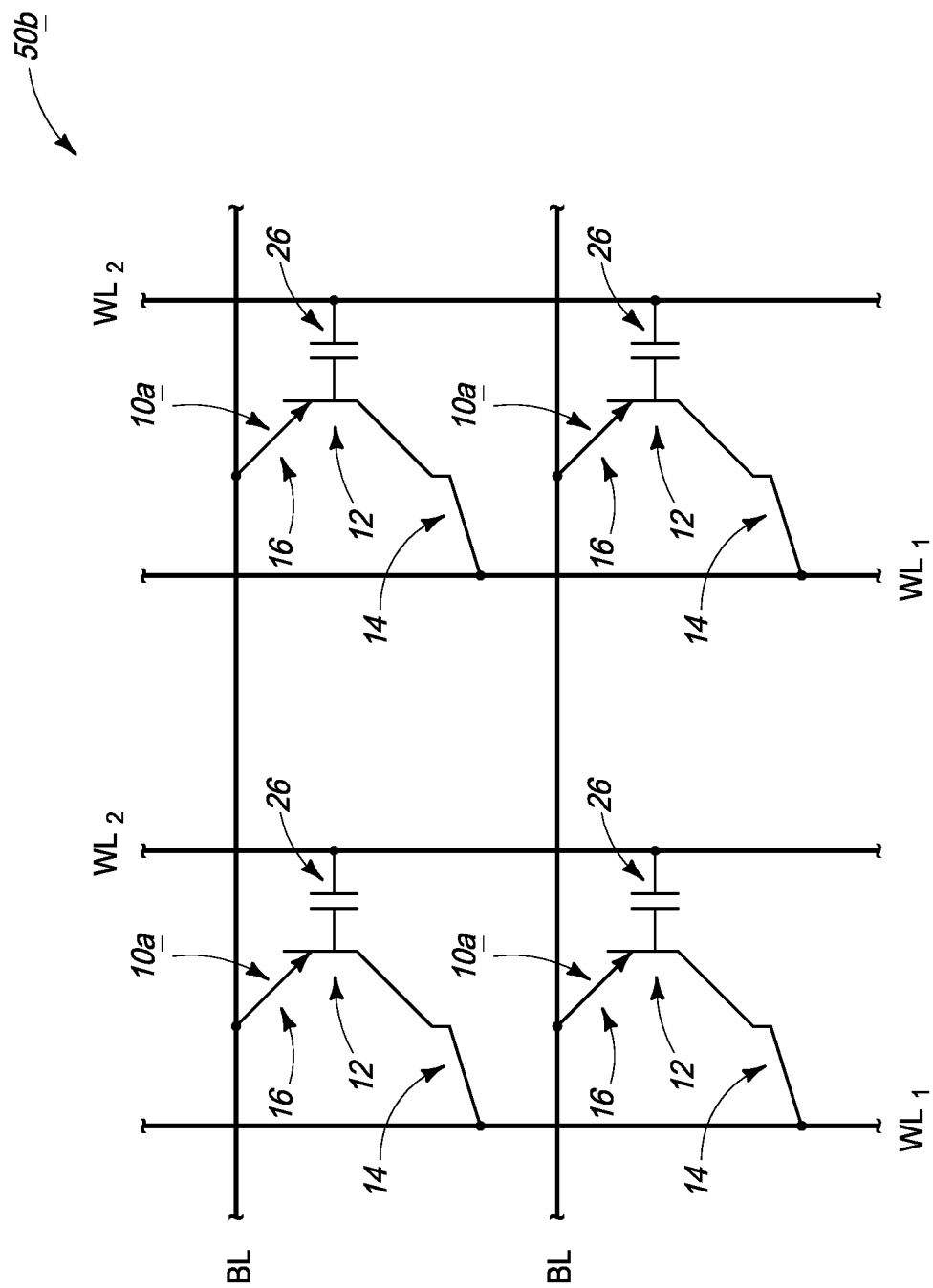
FIG. 9 is a diagrammatic schematic view of an example embodiment memory array comprising memory cells of the type shown in FIG. 2.

FIG. 8 diagrammatically illustrates various operations that may be utilized for programming individual memory cells of the array 50a into a "0" data state (i.e., "write 0" operations), programming the individual memory cells into a "1" data state (i.e., "write 1" operations), and for reading the memory cells to ascertain the data states of the individual memory cells. FIG. 8 also diagrammatically illustrates voltage of the P$_{base}$ (i.e., the base 12 of FIG. 1) during the various operations. Example voltage levels for the various states indicated in FIG. 8 may include (assuming a bandgap of 2.3 eV, and assuming a common voltage on nodes 51 of 0V):
VBLID=2V
VBLW0=2V
VBLRD=5V (D0, 5V; D1, 4V)
VBLW1=4V
VW2ID=−3V
VW2WT=2V
VW2RD=−1.4V FIG. 9 diagrammatically illustrates another example embodiment memory array 50b. The memory array of FIG. 9 comprises a plurality of memory cells 10a of the type described above with reference to FIG. 2. The memory array of FIG. 9, like that of FIG. 5, comprises a series of bitlines, a first series of wordlines (the series identified as WL$_1$), and a second series of wordlines (the series identified as WL$_2$). In some embodiments, the node 20 of FIG. 2 may correspond to a bitline (BL), the node 18 of FIG. 2 may correspond to a wordline of the first series (WL$_1$), and the gate 26 of FIG. 2 may be along a wordline of the second series (WL$_2$). In such embodiments, the emitter/collector regions 16 of memory cells 10a may be considered to be first emitter/collector regions which are directly coupled with bitlines, and the emitter/collector regions 14 of the memory cells may be considered to be second emitter/collector region which are electrically coupled with the first series of wordlines. Each memory cell of array 50b may be uniquely addressed through combinations containing one of the bitlines together with one of the wordlines WL$_2$ and/or one of the wordlines WL$_1$.

Figure 10:
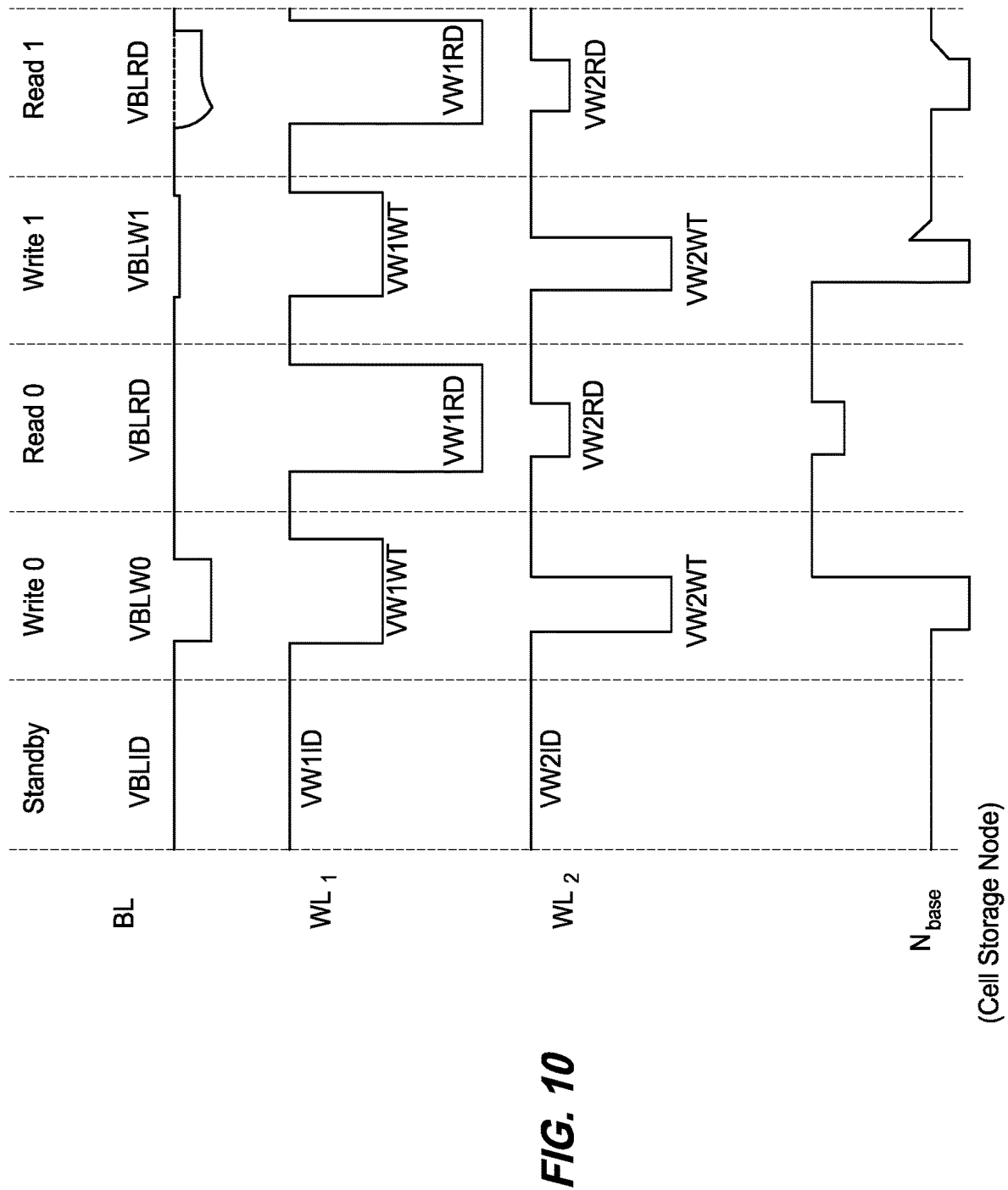
FIGS. 10 and 11 diagrammatically illustrate example embodiment operational arrangements for utilizing the memory array of FIG. 9.

FIG. 10 diagrammatically illustrates various operations that may be utilized for programming individual memory cells of the array 50b into a "0" data state (i.e., "write 0" operations), programming the individual memory cells into a "1" data state (i.e., "write 1" operations), and for reading the memory cells to ascertain the data states of the individual memory cells. FIG. 10 also diagrammatically illustrates voltage of the N$_{base}$ (i.e., the base 12 of FIG. 2) during the various operations. Example voltage levels for the various states indicated in FIG. 10 may include (assuming a bandgap of 2.3 eV):
VBLID=5V
VBLW0=4V
VBLRD=5V (D0, 5V; D1, 4V)
VBLW1=5V
VW1ID=5V

VW1WT=1V
VW1RD=0V
VW2ID=5V
VW2WT=0V
VW2RD=4V

Figure 11:
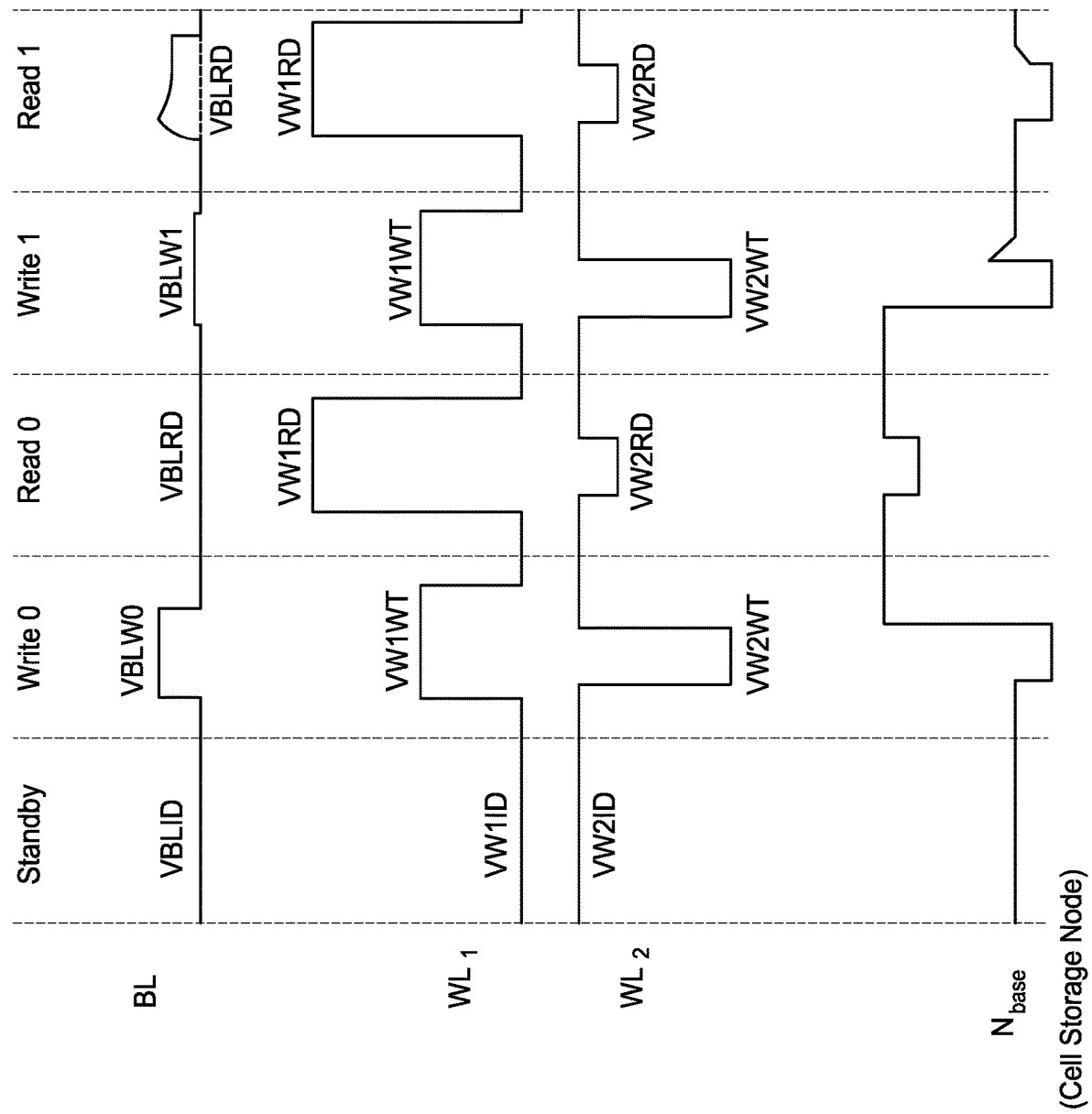
Figure 12:
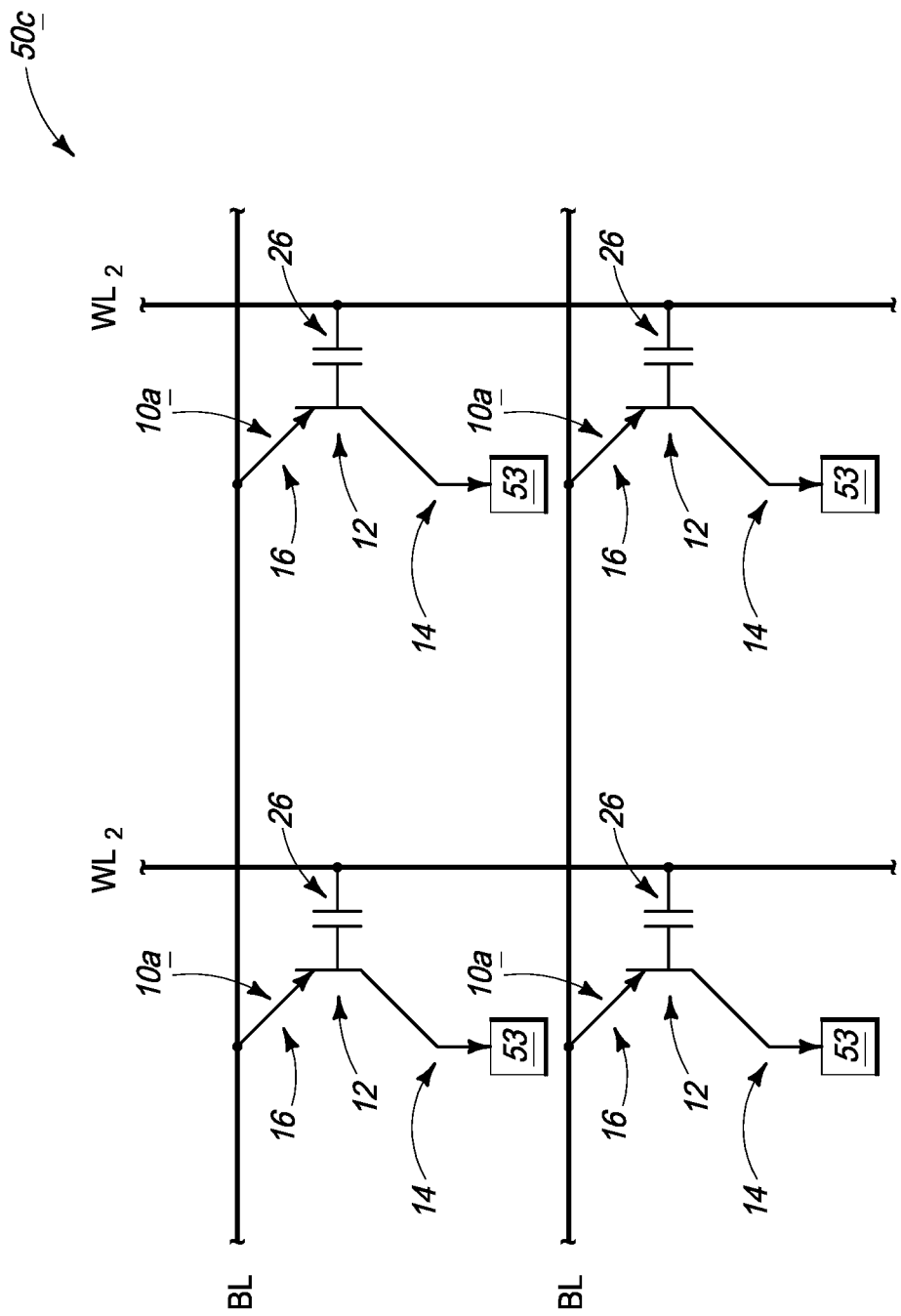
FIG. 12 is a diagrammatic schematic view of another example embodiment memory array comprising memory cells of the type shown in FIG. 2.

Another set of example voltage levels for the various states indicated in FIG. 10 may include (assuming a bandgap of 2.3 eV):
VBLID=5V
VBLW0=3V
VBLRD=5V (D0, 5V; D1, 4V)
VBLW1=5V
VW1ID=5V
VW1WT=0V
VW1RD=0V
VW2ID=5V
VW2WT=0V
VW2RD=4V FIG. 11 diagrammatically illustrates another set of operations that may be utilized for programming individual memory cells of the array 50b of FIG. 9 into a "0" data state (i.e., "write 0" operations), programming the individual memory cells into a "1" data state (i.e., "write 1" operations), and for reading the memory cells to ascertain the data states of the individual memory cells. FIG. 11 also diagrammatically illustrates voltage of the $N_{base}$ (i.e., the base 12 of FIG. 2) during the various operations. Example voltage levels for the various states indicated in FIG. 11 may include (assuming a bandgap of 2.3 eV):
VBLID=0V
VBLW0=2V
VBLRD=0V (D0, 0V; D1, 1V)
VBLW1=0V
VW1ID=0V
VW1WT=4V
VW1RD=5V
VW2ID=5V
VW2WT=0V
VW2RD=4V Another set of example voltage levels for the various states indicated in FIG. 11 may include (assuming a bandgap of 2.3 eV):
VBLID=0V
VBLW0=3V
VBLRD=0V (D0, 0V; D1, 1V)
VBLW1=0V
VW1ID=0V
VW1WT=5V
VW1RD=5V
VW2ID=5V
VW2WT=0V
VW2RD=4V FIG. 12 diagrammatically illustrates an example embodiment memory array 50c comprising a plurality of memory cells 10a of the type described above with reference to FIG. 2. The memory array of FIG. 12 is similar to that of FIG. 9, except that the first series of wordlines (WL$_1$ of FIG. 9) have been replaced with nodes 53. The nodes 53 are at a common voltage as one another, and in some embodiments may be electrically coupled with one another and with a common terminal (for instance, they may all be connected to an electrically conductive plate).

In some embodiments, the node 20 of FIG. 2 may correspond to the bitline (BL) of FIG. 12, the node 18 of FIG. 2 may correspond to a node 53, and the gate 26 of FIG. 2 may be along a wordline of the series (WL$_2$). In such embodiments, the emitter/collector regions 16 of memory cells 10a may be considered to be first emitter/collector regions which are directly coupled with bitlines, and the emitter/collector regions 14 of the memory cells may be considered to be second emitter/collector regions which are electrically coupled with one another and with a common terminal. Each memory cell of array 50c may be uniquely addressed through combinations containing one of the bitlines together with one of the wordlines WL$_2$.

Figure 13:
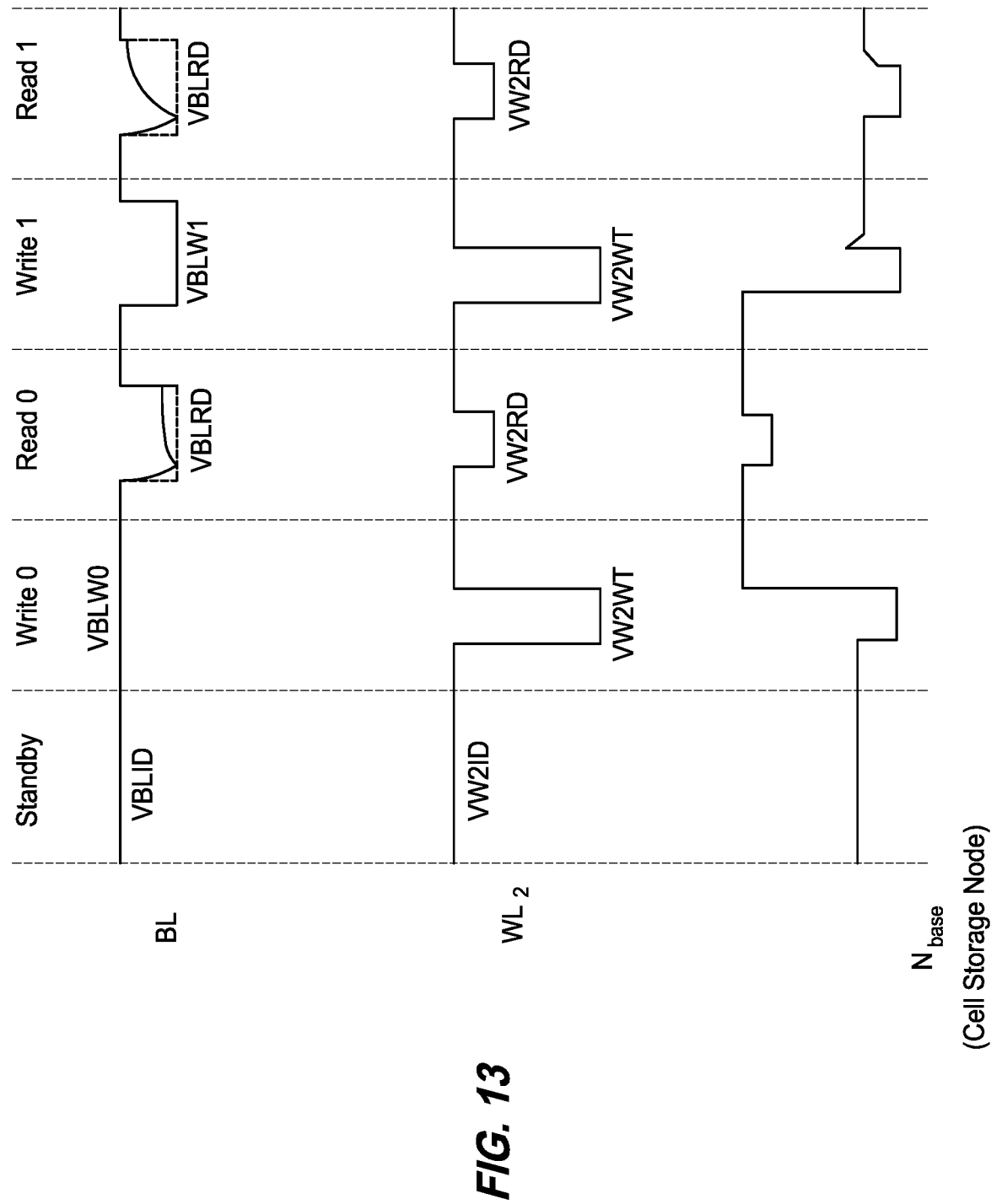
FIGS. 13 and 14 diagrammatically illustrate example embodiment operational arrangements for utilizing the memory array of FIG. 12.
Figure 14:
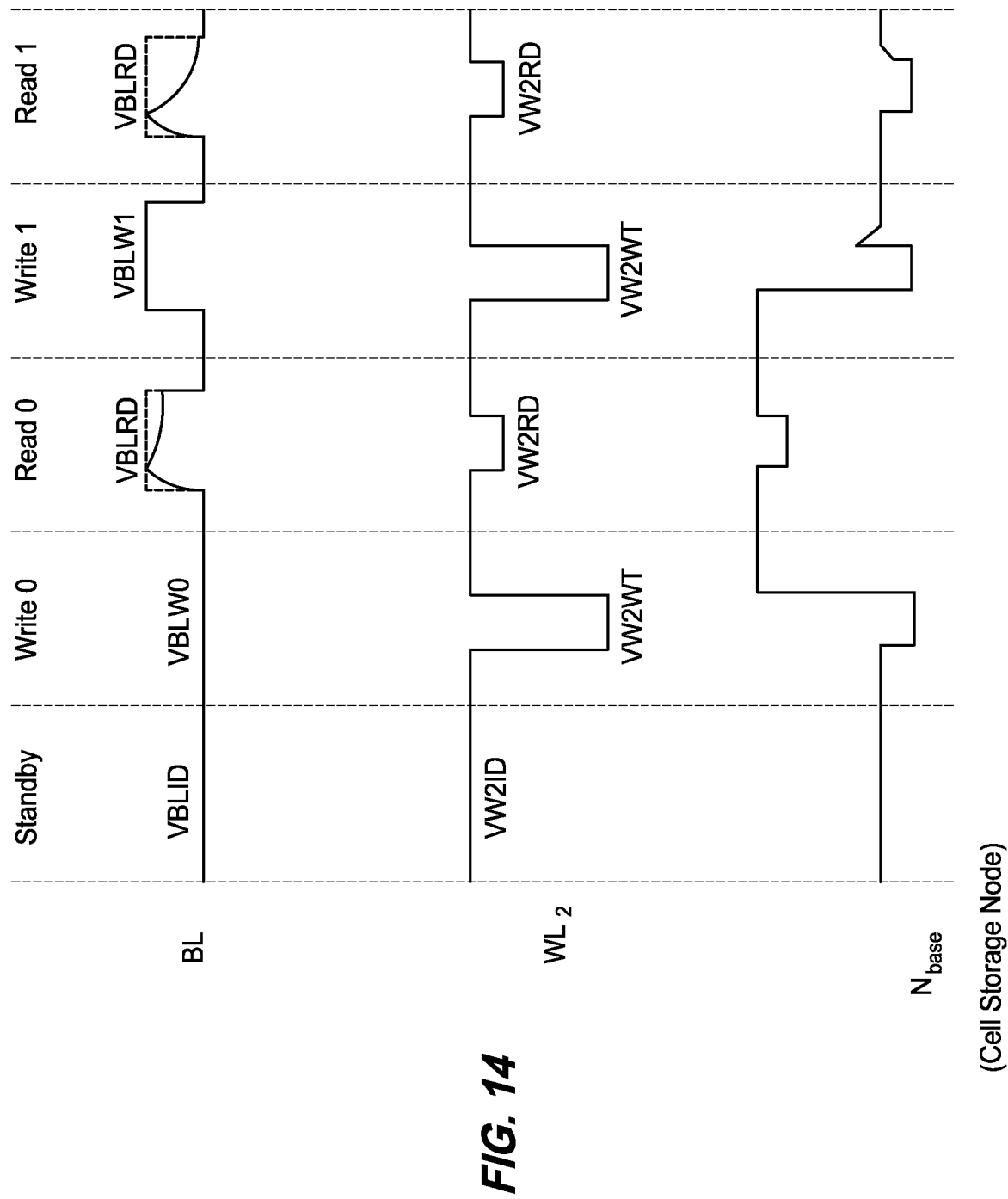
Figure 16:
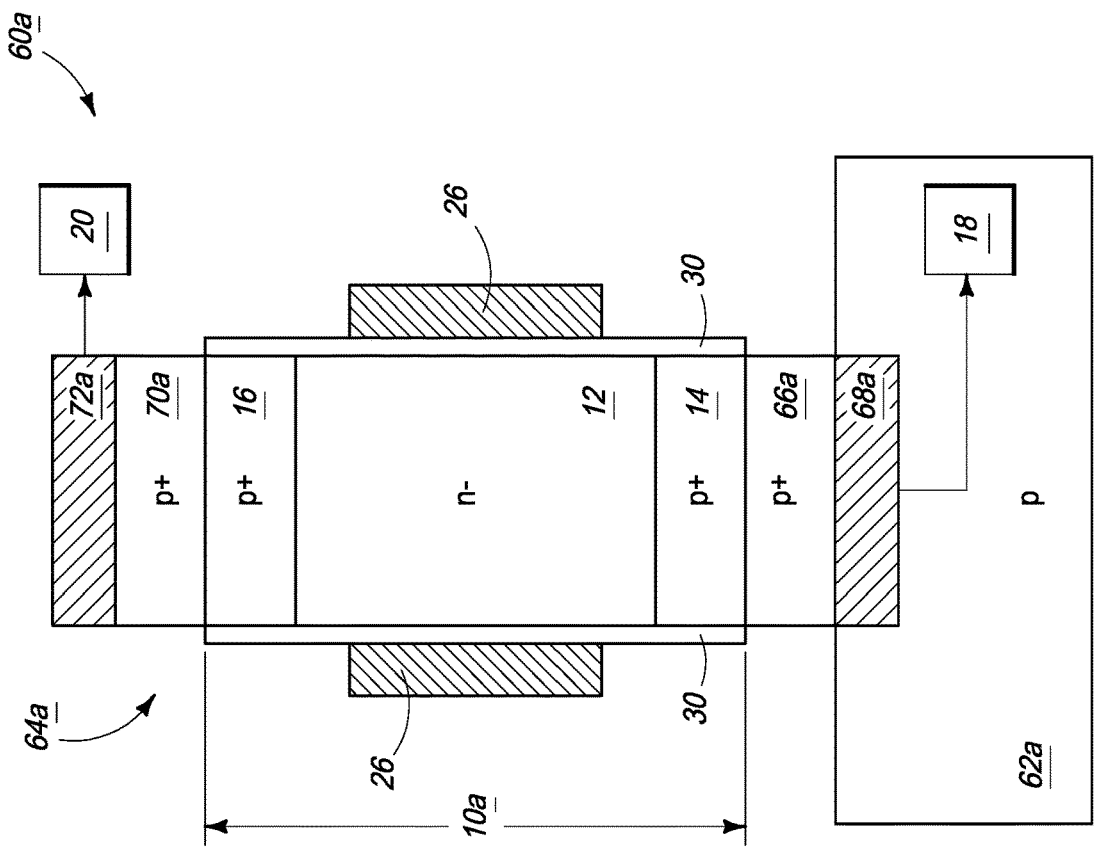
FIG. 16 is a diagrammatic cross-sectional view of another example embodiment memory cell.
Figure 15:
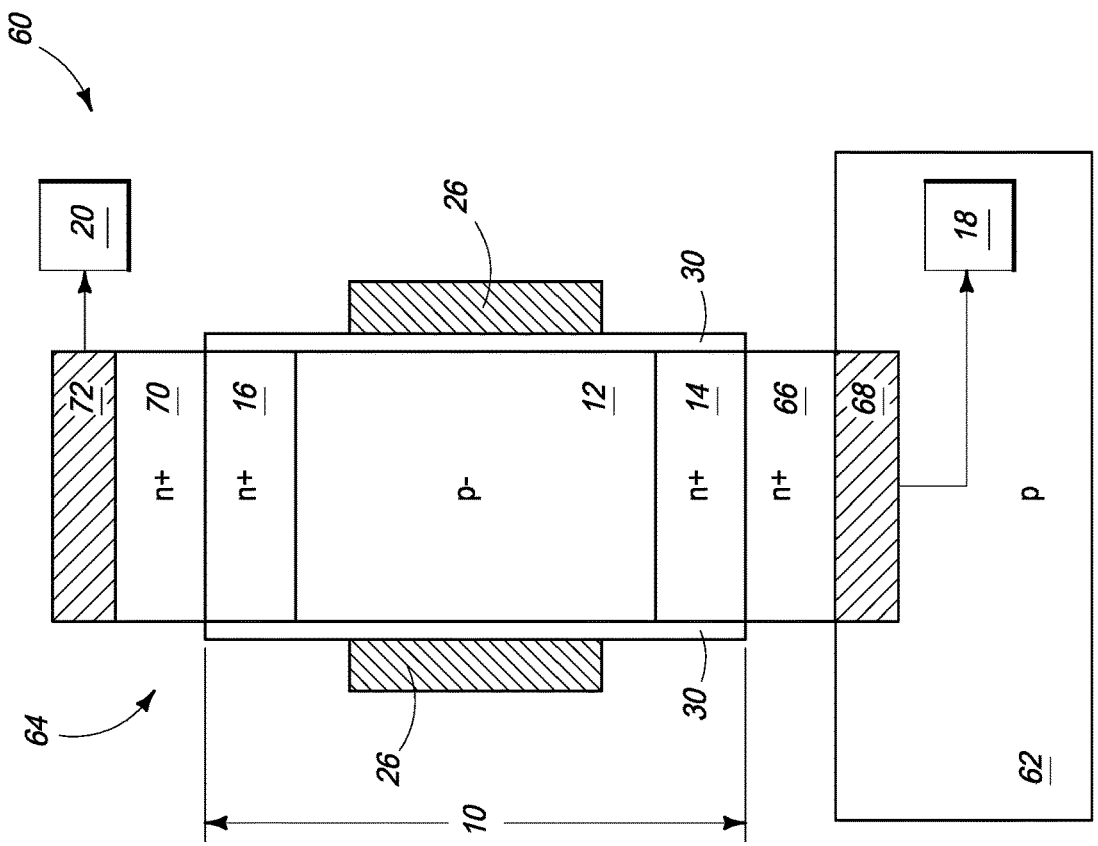
FIG. 15 is a diagrammatic cross-sectional view of another example embodiment memory cell.

FIG. 13 diagrammatically illustrates various operations that may be utilized for programming individual memory cells of the array 50c into a "0" data state (i.e., "write 0" operations), programming the individual memory cells into a "1" data state (i.e., "write 1" operations), and for reading the memory cells to ascertain the data states of the individual memory cells. FIG. 13 also diagrammatically illustrates voltage of the $N_{base}$ (i.e., the base 12 of FIG. 2) during the various operations. Example voltage levels for the various states indicated in FIG. 13 may include (assuming a bandgap of 2.3 eV, and assuming a common voltage on nodes 53 of 5V):
VBLID=3V
VBLW0=3V
VBLRD=0V (D0, 0V; D1, 1V)
VBLW1=0V
VW2ID=5V
VW2WT=0V
VW2RD=3.4V FIG. 14 diagrammatically illustrates another set of operations that may be utilized for programming individual memory cells of the array 50c of FIG. 12 into a "0" data state (i.e., "write 0" operations), programming the individual memory cells into a "1" data state (i.e., "write 1" operations), and for reading the memory cells to ascertain the data states of the individual memory cells. FIG. 14 also diagrammatically illustrates voltage of the $N_{base}$ (i.e., the base 12 of FIG. 2) during the various operations. Example voltage levels for the various states indicated in FIG. 14 may include (assuming a bandgap of 2.3 eV, and assuming a common voltage on nodes 53 of 0V):
VBLID=2V
VBLW0=2V
VBLRD=5V (D0, 5V; D1, 4V)
VBLW1=4V
VW2ID=5V
VW2WT=0V
VW2RD=3.4V The memory cells of FIGS. 1-4 may be readily incorporated into semiconductor constructions. FIGS. 15 and 16 illustrate example semiconductor constructions comprising the memory cell 10 of FIG. 1, and the memory cell 10a of FIG. 2, respectively.

Referring to FIG. 15, a semiconductor construction 60 comprises memory cell 10 supported over a semiconductor substrate 62. The substrate 62 may comprise, consist essentially of, or consist of monocrystalline silicon in some embodiments, and is shown to be p-type background doped. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although substrate 62 is shown to be homogenous, the substrate may comprise numerous materials in some embodiments. For instance, substrate 62 may correspond to a semiconductor substrate containing one or more materials associated with integrated circuit fabrication. Example materials that may be associated with integrated circuit fabrication are various of refractory metal materials, barrier materials, diffusion materials, insulator materials, etc.

The memory cell 10 is part of a substantially vertical pillar 64. Such pillar includes an n-type doped segment 66 directly over the semiconductor material of substrate 62 (the segment 66 is shown doped to an n+ dopant level). In some embodiments, segment 66 may comprise monocrystalline silicon patterned from substrate 62, and/or may comprise semiconductor material deposited over substrate 62. The segment 66 is shown electrically coupled with an electrically conductive material 68 that interconnects with node 18. The conductive material 68 may be any suitable material; including, for example, any of various metals, metal-containing compositions, and/or conductive-doped semiconductor materials. The conductive material 68 may be a separate material from the conductively-doped material of segment 66 (as shown), or may be an extension of the conductively-doped material 66. In some embodiments, segment 66 may be omitted and emitter/collector region may directly contact a conductive node 18 comprising, consisting essentially of, or consisting of any of various metals and/or metal-containing compositions.

The pillar 64 is referred to as being "substantially vertical" to indicate that it extends substantially orthogonally to a primary upper surface of the substrate. Specifically, the term "vertical" is used herein to define a relative orientation of an element or structure with respect to a major plane or surface of a wafer or substrate. A structure may be referred to as being "substantially vertical" to indicate that the structure is vertical to within reasonable tolerances of fabrication and measurement.

The pillar 64 also includes an n-type doped segment 70 directly over the emitter/collector region 16. The segment 70 may comprise silicon and/or any other suitable semiconductor material. The segment 70 is shown electrically coupled with an electrically conductive material 72 that interconnects with node 20. The conductive material 72 may be any suitable material; including, for example, any of various metals, metal-containing compositions, and/or conductive-doped semiconductor materials. The conductive material 72 may be a separate material from the conductively-doped material of segment 70 (as shown), or may be an extension of the conductively-doped material 70. In some embodiments, segment 70 may be omitted and emitter/collector region 16 may directly contact a conductive node 20 comprising, consisting essentially of, or consisting of any of various metals and/or metal-containing compositions.

Referring to FIG. 16, a semiconductor construction 60a comprises memory cell 10a supported over a semiconductor substrate 62a. The substrate 62a may comprise any of the compositions discussed above with reference to the substrate 62 of FIG. 15.

The memory cell 10a is part of a substantially vertical pillar 64a. Such pillar includes a p-type doped segment 66a directly over the semiconductor material of substrate 62a. The segment 66a is shown electrically coupled with an electrically conductive material 68a that interconnects with node 18. The conductive material 68a may be any of the materials discussed above with reference to the material 68 of FIG. 15. The conductive material 68a may be a separate material from the conductively-doped material of segment 66a (as shown), or may be an extension of the conductively-doped material 66a. In some embodiments, segment 66a may be omitted and emitter/collector region may directly contact a conductive node 18 comprising, consisting essentially of, or consisting of any of various metals and/or metal-containing compositions.

The pillar 64a also includes a p-type doped segment 70a directly over the emitter/collector region 16. The segment 70a may comprise silicon and/or any other suitable semiconductor material. The segment 70a is shown electrically coupled with an electrically conductive material 72a that interconnects with node 20. The conductive material 72a may comprise any of the materials discussed above with reference to the material 72 of FIG. 15. The conductive material 72a may be a separate material from the conductively-doped material of segment 70a (as shown), or may be an extension of the conductively-doped material 70a. In some embodiments, segment 70a may be omitted and emitter/collector region 16 may directly contact a conductive node 20 comprising, consisting essentially of, or consisting of any of various metals and/or metal-containing compositions.

In some embodiments, the memory cells having wide-bandgap material may be formed along one or more levels (or tiers) of an integrated circuit chip, and may be formed over one or more levels of logic or other circuitry fabricated by conventional methods (for instance, such other circuitry may comprise metal-oxide-semiconductor field-effect transistors (MOSFET). Additionally, or alternatively, one or more levels of conventional circuitry may be fabricated over the memory cells containing the wide-bandgap material.

The various memory cells and memory arrays of FIGS. 1-16 may be formed utilizing any suitable processing. For instance, FIGS. 17 and 18 illustrate an example process for fabricating a memory array 50a of the type shown in FIG. 7 comprising memory cells 10 of the type shown in FIG. 1.

Figure 17:
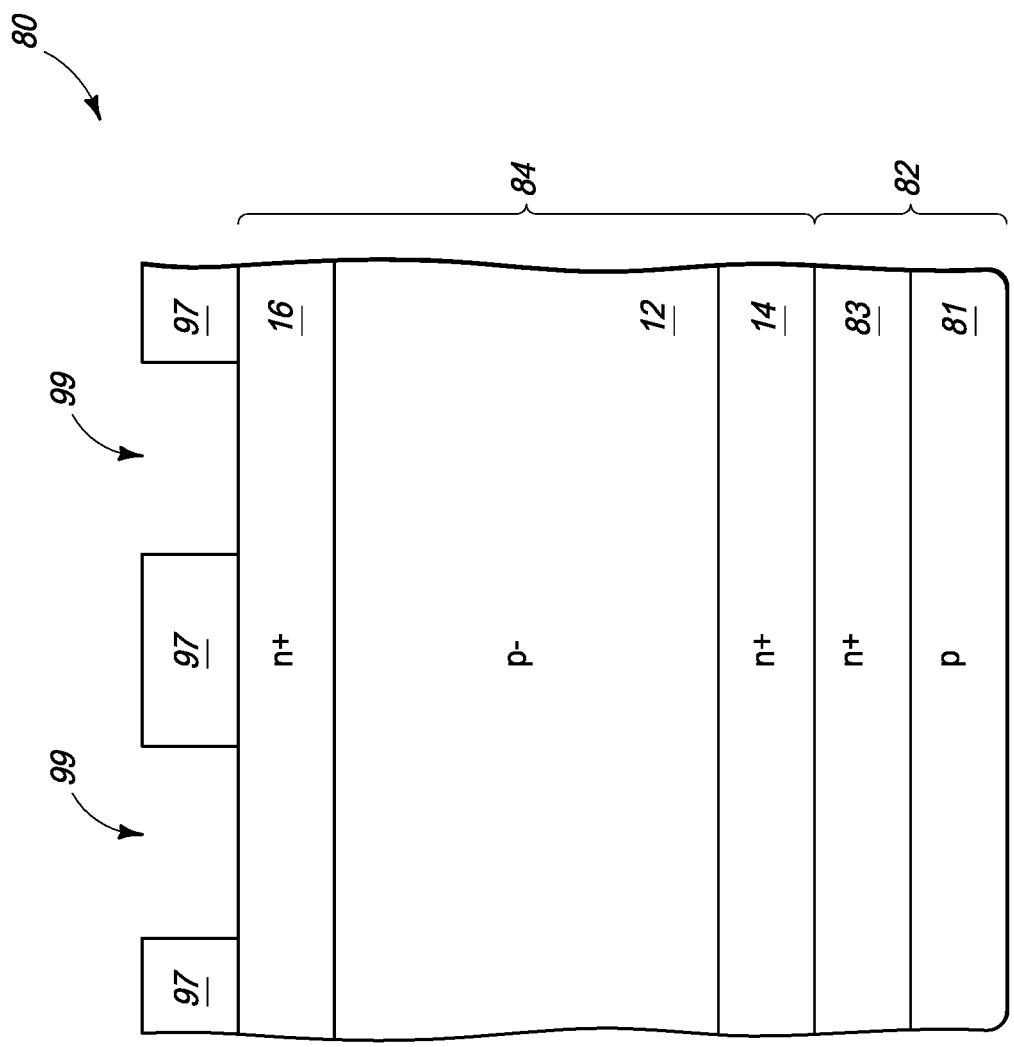
FIGS. 17 and 18 diagrammatically illustrate process stages of an example embodiment method for fabricating an array of memory cells.
Figure 18:
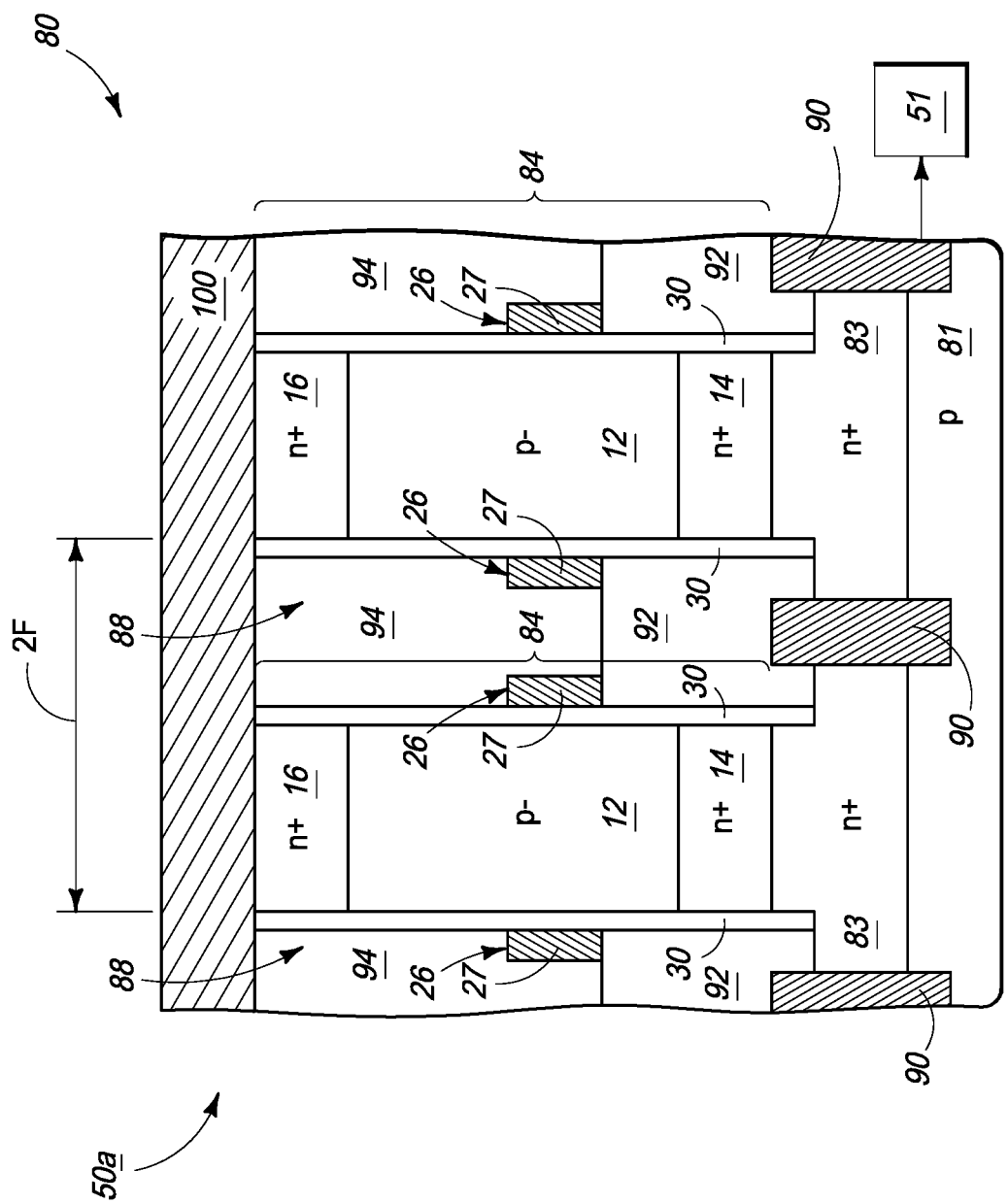

Referring to FIG. 17, a semiconductor construction 80 comprises a substrate 82 having an n-type doped region 83 over a p-type doped region 81. The substrate 82 may be a semiconductor substrate analogous to the substrate 62 discussed above with reference to FIG. 15. Accordingly, the regions 81 and 83 may be conductively-doped regions of a monocrystalline silicon wafer, and/or may be conductively-doped regions formed along a tier of a partially-fabricated integrated circuit.

Conductively-doped regions 12, 14 and 16 of a memory cell stack 84 are formed over substrate 82. In some embodiments, the entire stack 84 may comprise, consist essentially of, or consist of doped wide-bandgap material (such as, for example, 3C—SiC). If doped region 83 comprises monocrystalline silicon and the wide-bandgap material comprises silicon carbide, the wide-bandgap material may be epitaxially grown over the monocrystalline silicon.

A difficulty encountered in incorporating wide-bandgap materials (such as, for example, silicon carbide) into integrated circuit fabrication sequences is that dopant activation within the wide-bandgap materials may utilize a thermal budget which is too high for many of the components conventionally utilized in integrated circuitry. A method of reducing the thermal budget for dopant activation is to in situ dope the wide-bandgap material during epitaxial growth of such material.

A patterned mask 97 is formed over memory cell stack 84, with such patterned mask defining a pattern corresponding to a plurality of openings 99 that extend through the mask. The patterned mask may comprise any suitable composition and may be formed with any suitable processing. For instance, the mask may comprise photolithographicallypatterned photoresist. As another example, the mask may comprise one or more structures formed utilizing pitch multiplication methodologies.

Referring to FIG. 18, a pattern is transferred from mask 97 (FIG. 17) into stack 84 with one or more suitable etches, and then the mask is removed. The memory cell stack 84 is thus patterned into substantially vertical BJT pillars 88. Subsequently, dielectric material 30 is formed along sidewalls of the pillars.

Electrically-conductive interconnects 90 are formed between the pillars and in electrical connection with doped region 83. The interconnects 90 may be electrically coupled with one another through doped region 83 and/or through other interconnections, and may all be electrically connected to a common terminal so that they are all tied to the common voltage 51 (as shown).

The dielectric material 30 may be formed by initially providing surface passivation along outer exposed surfaces of pillars 88. Such surface passivation may comprise providing a layer containing silicon, oxygen and nitrogen along the outer surfaces. Such layer may be formed by nitridation/oxidation of exposed outer surfaces of silicon carbide in some embodiments, and/or by deposition of passivation material along the exposed outer surfaces. The dielectric material 30 may consist of the passivation layer in some embodiments. In other embodiments, additional dielectric materials may be formed along the passivation layer to form a dielectric material 30 comprising the passivation layer in combination with other dielectric materials. Such other dielectric materials may comprise, for example, one or both of silicon dioxide and silicon nitride.

In some embodiments, material 90 may comprise metal or other thermally-sensitive material, and an advantage of forming conductive material 90 after the doping of wide-bandgap material is that such can avoid exposure of the thermally-sensitive material to the thermal budget utilized for the doping of the wide-bandgap material.

Electrically insulative material 92 is formed over conductive material 90 and between the pillars 88, and then the conductive material 27 is formed and patterned over insulative material 92 to form the gates 26. Subsequently, another insulative material 94 is formed over gates 26 and insulative material 92. The electrically insulative materials 92 and 94 may comprise any suitable compositions or combinations of compositions, including for example, one or more of silicon dioxide, silicon nitride, and any of various doped oxide glasses (for instance, borophosphosilicate glass, phosphosilicate glass, fluorosilicate glass, etc.). The electrically insulative materials 92 and 94 may be the same composition as one another in some embodiments, and may differ in composition from one another in other embodiments.

A bitline 100 is formed across the pillars 88, and in direct electrical contact with the upper doped regions 16 within such pillars. The bitline 100 may be considered to be an example of a node 20 (FIG. 1) that may be formed in direct electrical connection with the upper emitter/collector regions 16 of the illustrated example embodiment memory cells. Bitline 100 may comprise any suitable electrically conductive material, and may, for example, comprise, consist essentially of, or consist of one or more of various metals, metal-containing compositions and conductively-doped semiconductor materials. Although the bitline is shown formed directly against the emitter/collector region 16, in other embodiments there may be one or more electrically-conductive materials between the bitline and the emitter/collector region (such as, for example, an electrically conductive material analogous to the conductively-doped semiconductor material 70 of FIG. 15).

The construction 80 has a dimension from one side of a pillar to a same side of an adjacent pillar of 2F, and thus the individual memory cells may have footprints of about $4F^2$.

Although FIGS. 17 and 18 pertain to formation of memory cells 10 of the type shown in FIG. 1 in a memory array of the type shown in FIG. 7, persons of ordinary skill will recognize that similar processing may be utilized to form any of the other memory cells described in this disclosure in any of the memory arrays described in this disclosure.

The memory cells and memory arrays discussed above may be incorporated into integrated circuit chips or packages, and such may utilized in electronic devices and/or systems. The electronic systems may be used in, for example, memory modules, device drivers, power modules, communication modems, processor modules, and application-specific modules, and may include multilayer, multi-chip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. A method of forming a memory array, comprising:
   forming a series of access lines;
   forming a series of bitlines;
   forming a plurality of gated bipolar junction transistors, individual gated bipolar junction transistors comprised by the plurality of gated bipolar junction transistors each being uniquely addressed through combinations containing a single bitline comprised by the series of bitlines and a single access line comprised by the series of access lines, each of the individual gated bipolar junction transistors being formed by a methodology comprising:

forming a vertical transistor pillar having a pair of opposing sidewalls, the pair of opposing sidewalls including a first sidewall and a second sidewall, the vertical transistor pillar having a base region between a pair of emitter/collector regions, one of the pair of emitter/collector regions being a first emitter/collector region and the other being a second emitter/collector region, the first emitter/collector region interfacing the base region at a first junction and the second emitter/collector region interfacing the base region at a second junction, the first emitter/collector region being directly electrically coupled with the single bitline;

forming a first depletion region disposed at an interface of the base region and the first emitter/collector region, and forming a second depletion region disposed at an interface of the base region and the second emitter/collector region, the first depletion region and the second depletion region each comprising a silicon carbide material having a bandgap greater than or equal to 1.2 eV at 300 K, a portion of the first emitter/collector region comprising a non-silicon carbide material, a portion of the second emitter/collector region comprising the non-silicon carbide material, and a portion of the base region comprising the non-silicon carbide material, the non-silicon carbide material having a narrow bandgap; and forming a gate along the base region of the vertical transistor pillar, the gate not vertically overlapping either of the first junction and the second junction; and forming a dielectric material extending along an entirety of a vertical height of each of the first sidewall and the second sidewall of the vertical transistor pillar, a portion of the dielectric material along the first depletion region comprising silicon, oxygen and nitrogen.

2. The memory array of claim 1, further comprising coupling all of the second emitter/collector regions with one another and with a common terminal.

3. The memory array of claim 1, wherein the series of access lines is a first series of access lines, and further comprising forming a second series of access lines, one of the access lines comprised by the second series of access lines being directly electrically coupled with the second emitter/collector region.

4. A method of forming a gated bipolar junction transistor, comprising:

forming a plurality of vertical transistor pillars over a monocrystalline substrate, each individual vertical transistor pillar comprised by the plurality of vertical transistor pillars comprising, in ascending order over the substrate:

a first region comprising a first narrow-bandgap material;

a second region comprising a first wide-bandgap material having a bandgap of greater than or equal to 1.2 eV;

a third region comprising a second narrow-bandgap material;

a fourth region comprising a second wide-bandgap material having a bandgap of greater than or equal to 1.2 eV; and a fifth region comprising a third narrow-bandgap material;

forming a dielectric regions along opposing sidewalls of each individual vertical transistor pillar; and forming gates extending along the opposing sidewalls of each individual vertical transistor pillar, the gates being directly against the dielectric regions and being formed along the third region without overlapping the second region and without overlapping the fourth region.

5. The method of claim 4, wherein the first wide-bandgap material comprises silicon carbide.

6. The method of claim 4, wherein the second wide-bandgap material comprises silicon carbide.

7. The method of claim 4, wherein the dielectric region comprises a passivation material in direct physical contact with the opposing sidewalls of each of the individual vertical transistor pillars.

8. The method of claim 7, wherein the passivation material comprises silicon, oxygen and nitrogen.

\* \* \* \* \*

UNITED STATES PATENT AND TRADEMARK OFFICE
CERTIFICATE OF CORRECTION

PATENT NO.        : 10,886,273 B2
APPLICATION NO.   : 16/436689
DATED             : January 5, 2021
INVENTOR(S)       : Rajesh N. Gupta, Farid Nemati and Scott T. Robins Page 1 of 1

It is certified that error appears in the above-identified patent and that said Letters Patent is hereby corrected as shown below:

In the Claims

Column 17, Line 41 - Replace "The memory array of claim 1" with --The method of claim 1--

Column 18, Line 1 - Replace "The memory array of claim 1" with --The method of claim 1--

Column 18, Line 26 - Replace "forming a dielectric regions" with --forming dielectric regions--

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*